(12) United States Patent
Kido et al.

(10) Patent No.: US 10,157,877 B2
(45) Date of Patent: Dec. 18, 2018

(54) SEMICONDUCTOR DEVICE AND MANUFACTURING METHOD OF SEMICONDUCTOR DEVICE

(71) Applicant: FUJI ELECTRIC CO., LTD., Kawasaki-shi, Kanagawa (JP)

(72) Inventors: Kazumasa Kido, Kawasaki (JP); Takashi Saitou, Kawasaki (JP); Kyouhei Fukuda, Kawasaki (JP); Shinji Tada, Kawasaki (JP); Fumihiko Momose, Kawasaki (JP); Yoshitaka Nishimura, Kawasaki (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 341 days.

(21) Appl. No.: 14/878,903

(22) Filed: Oct. 8, 2015

(65) Prior Publication Data
US 2016/0035690 A1 Feb. 4, 2016

Related U.S. Application Data

(63) Continuation of application No. PCT/JP2014/062535, filed on May 9, 2014.

(30) Foreign Application Priority Data

May 10, 2013 (JP) ................................ 2013-100651

(51) Int. Cl.
| | |
|---|---|
| H01L 23/00 | (2006.01) |
| B23K 1/00 | (2006.01) |
| B23K 35/26 | (2006.01) |
| C22C 13/02 | (2006.01) |
| H01L 21/52 | (2006.01) |
| B23K 1/008 | (2006.01) |
| B23K 1/012 | (2006.01) |
| B23K 1/20 | (2006.01) |
| B23K 35/02 | (2006.01) |
| B23K 1/19 | (2006.01) |
| B23K 103/00 | (2006.01) |
| B23K 101/42 | (2006.01) |
| H01L 23/051 | (2006.01) |

(52) U.S. Cl.
CPC ............... *H01L 24/29* (2013.01); *B23K 1/00* (2013.01); *B23K 1/0008* (2013.01); *B23K 1/008* (2013.01); *B23K 1/0016* (2013.01); *B23K 1/012* (2013.01); *B23K 1/19* (2013.01); *B23K 1/203* (2013.01); *B23K 35/025* (2013.01); *B23K 35/0244* (2013.01); *B23K 35/26* (2013.01); *B23K 35/262* (2013.01); *C22C 13/02* (2013.01); *H01L 21/52* (2013.01); *H01L 24/32* (2013.01); *H01L 24/83* (2013.01); *B23K 2103/56* (2018.08); *B23K 2201/42* (2013.01); *B23K 2203/56* (2015.10); *H01L 23/051* (2013.01); *H01L 24/45* (2013.01); *H01L 24/73* (2013.01); *H01L 2224/2932* (2013.01); *H01L 2224/29111* (2013.01); *H01L 2224/32225* (2013.01); *H01L 2224/32501* (2013.01); *H01L 2224/45124* (2013.01); *H01L 2224/73265* (2013.01); *H01L 2224/83447* (2013.01); *H01L 2224/83815* (2013.01); *H01L 2924/351* (2013.01)

(58) Field of Classification Search
None
See application file for complete search history.

(56) References Cited

U.S. PATENT DOCUMENTS

| | | | |
|---|---|---|---|
| 4,170,472 A | 10/1979 | Olsen et al. | |
| 4,670,217 A | 6/1987 | Henson et al. | |
| 5,352,407 A | 10/1994 | Seelig et al. | |
| 5,393,489 A | 2/1995 | Gonya et al. | |
| 5,405,577 A | 4/1995 | Seelig et al. | |
| 5,733,501 A | 3/1998 | Takao et al. | |
| 6,229,248 B1 | 5/2001 | Kusabiraki et al. | |
| 6,416,883 B1 | 7/2002 | Walton | |
| 2003/0222126 A1* | 12/2003 | Morozumi | B23K 1/0016 228/219 |
| 2007/0125449 A1 | 6/2007 | Kajiwara et al. | |
| 2010/0084050 A1 | 4/2010 | Kraemer et al. | |
| 2012/0018048 A1 | 1/2012 | Yamashita et al. | |
| 2012/0175020 A1 | 7/2012 | Imamura et al. | |
| 2016/0035690 A1* | 2/2016 | Kido | H01L 24/29 428/686 |

FOREIGN PATENT DOCUMENTS

| | | | | |
|---|---|---|---|---|
| CN | 101500744 A | 8/2009 | | |
| EP | 2578350 A1 * | 4/2013 | ......... | B23K 35/0244 |
| JP | S61-269998 A | 11/1986 | | |
| JP | H07-284983 A | 10/1995 | | |
| JP | H08-1372 A | 1/1996 | | |
| JP | H09-70687 A | 3/1997 | | |
| JP | H11-291083 A | 10/1999 | | |
| JP | 2001-520585 A | 10/2001 | | |
| JP | 2001-334385 A | 12/2001 | | |
| JP | 2002-018590 A | 1/2002 | | |
| JP | 3353640 B2 | 12/2002 | | |
| JP | 3353662 B2 | 12/2002 | | |

(Continued)

*Primary Examiner* — Adam Krupicka
(74) *Attorney, Agent, or Firm* — Rabin & Berdo, P.C.

(57) ABSTRACT

A solder joint layer has a structure in which plural fine-grained second crystal sections (22) precipitate at crystal grain boundaries between first crystal sections (21) dispersed in a matrix. The first crystal sections (21) are Sn crystal grains containing tin and antimony in a predetermined proportion. The second crystal sections (22) are made up of a first portion containing a predetermined proportion of Ag atoms with respect to Sn atoms, or a second portion containing a predetermined proportion of Cu atoms with respect to Sn atoms, or both. The solder joint layer may have third crystal sections (23) which are crystal grains that contain a predetermined proportion of Sb atoms with respect to Sn atoms. As a result, solder joining is enabled at a low melting point, and a highly reliable solder joint layer having a substantially uniform metal structure can be formed.

8 Claims, 17 Drawing Sheets

(56) References Cited

FOREIGN PATENT DOCUMENTS

| | | | |
|---|---|---|---|
| JP | 2003-290975 | A | 10/2003 |
| JP | 2004-154845 | A | 6/2004 |
| JP | 3673021 | B2 | 7/2005 |
| JP | 2005-340268 | A | 12/2005 |
| JP | 2010-505625 | A | 2/2010 |
| JP | 4471825 | B2 | 6/2010 |
| JP | 2011-005545 | A | 1/2011 |
| JP | 4609296 | B2 | 1/2011 |
| JP | 4787384 | B1 | 10/2011 |
| WO | WO-2008/004531 | A2 | 1/2008 |
| WO | WO-2011/027659 | A1 | 3/2011 |

\* cited by examiner

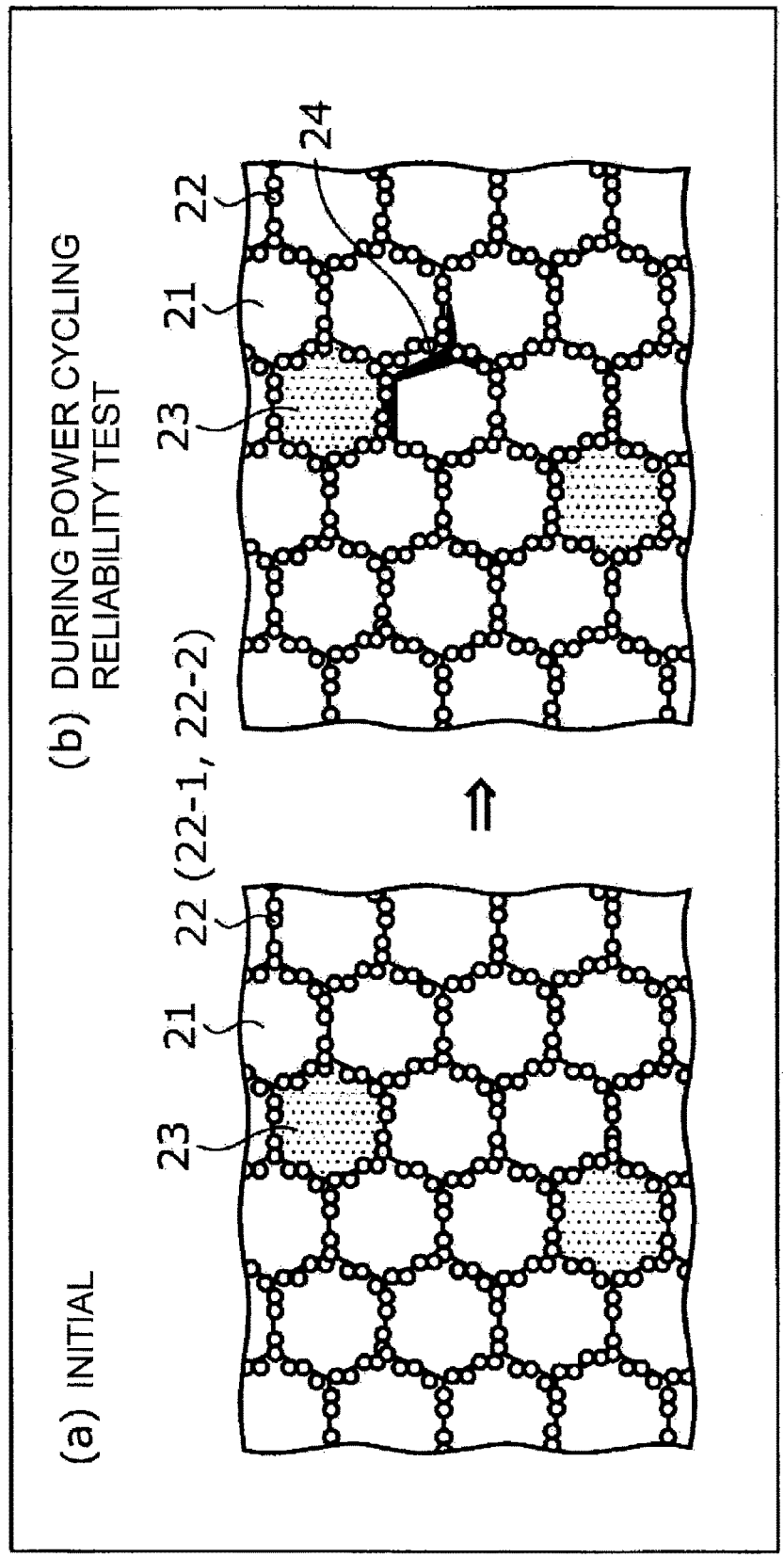

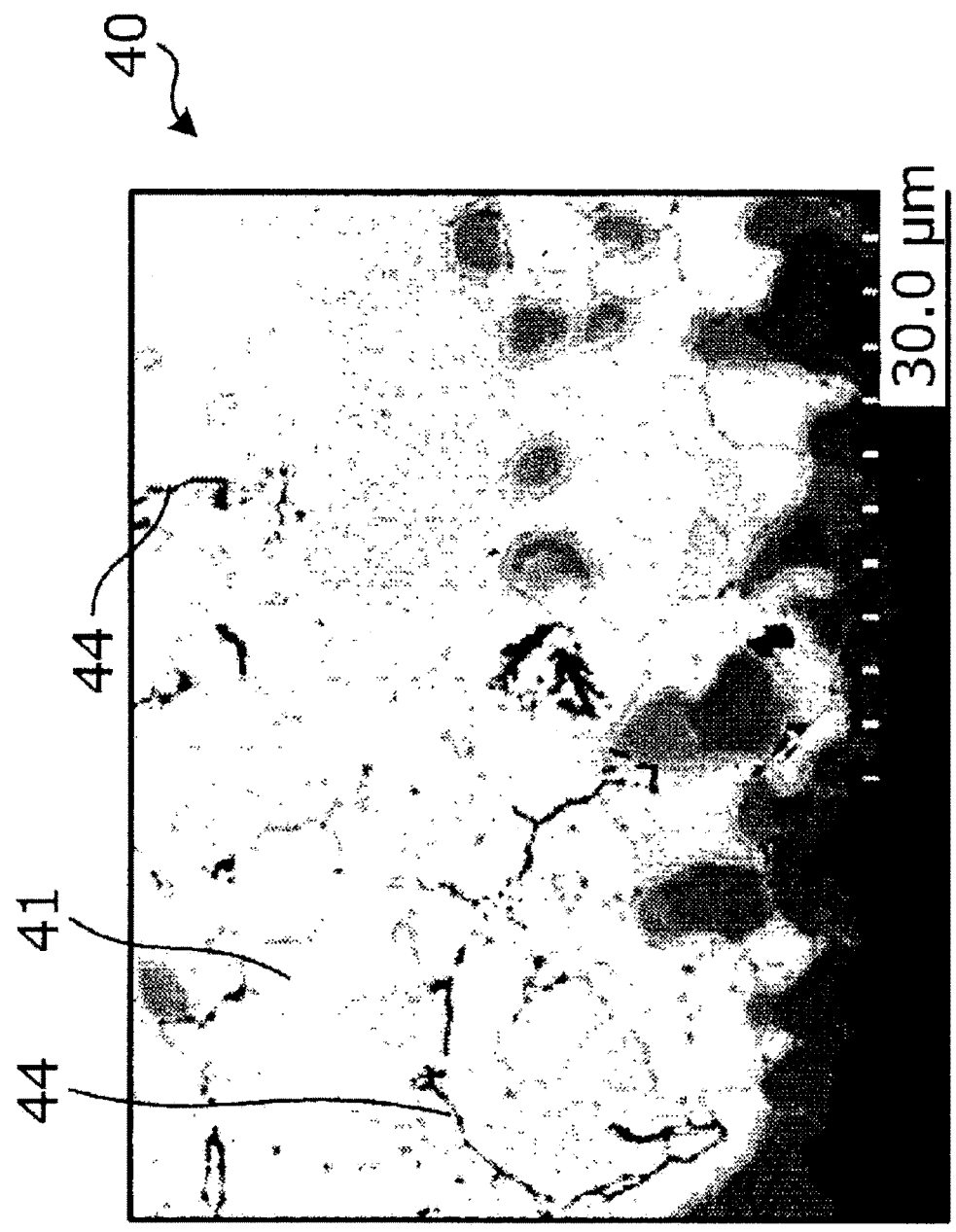

SEMICONDUCTOR DEVICE AND MANUFACTURING METHOD OF SEMICONDUCTOR DEVICE

BACKGROUND OF THE INVENTION

1. Field of the Invention

The embodiments discussed herein are related to a semiconductor device and a manufacturing method of a semiconductor device.

2. Description of the Related Art

Conventionally known semiconductor devices include devices that have a package structure in which a semiconductor chip is joined to a circuit pattern that is provided on an insulating substrate, and solder materials that enable joining at a comparatively low temperature are used as joining materials for joining the semiconductor chip and the circuit pattern. As such solder materials, solder having tin (Sn) as a main component, for instance tin-silver (Sn—Ag)-based solder materials and highly reliable tin-antimony (Sn—Sb)-based solder materials that enable joining at a low melting point, is used. The state of a Sn—Ag-based solder material after solder joining and the state of a Sn—Sb-based solder material will be discussed next.

The melting point of a solder having Sn as a main component ranges from about 200° C. to 300° C. A solder joint layer that utilizes solder having Sn as a main component exhibits a structure having Sn crystal grains dispersed therein. In a solder joint layer that utilizes a Sn 100% solder material, Sn crystal grains undergo coarsening at high temperature; moreover, changes in temperature cause the solder joint layer to be subject to stress derived from differences in the coefficient of linear expansion with respect to non-joining materials. As a result, a problem arises in that grain boundary cracks occur at the crystal grain boundaries between Sn crystal grains, and these grain boundary cracks progress to crystal grain boundaries between adjacent Sn crystal grains. Known solder materials in which such progress of grain boundary cracks is prevented include Sn—Ag-based solder materials and Sn—Sb-based solder materials.

FIG. 7 is an explanatory diagram illustrating schematically the state of a solder joint layer by a conventional Sn—Ag-based solder material. In FIG. 7, (a) illustrates an initial state (before application of a thermal load, for instance from power cycling) of a solder joint layer by a conventional Sn—Ag-based solder material (hereafter referred to as Sn—Ag-based solder joint layer). The Sn—Ag-based solder material is a precipitation-strengthened solder material. As illustrated in (a) of FIG. 7, Ag forms virtually no solid solution in Sn crystal grains in solder joint layers that utilize a conventional Sn—Ag-based solder material; accordingly, Ag yields a fine-grained hard $Ag_3Sn$ compound 122, and precipitates at crystal grain boundaries between Sn crystal grains 121 that are dispersed as a matrix. The crystal grain boundaries between Sn crystal grains 121 are strengthened as a result and the crystals do not deform readily. Consequently, the grain boundary cracks progress less readily than is the case in solder joint layers of simple Sn crystal grains.

FIG. 8 is an explanatory diagram illustrating schematically the state of a solder joint layer by a conventional Sn—Sb-based solder material. In FIG. 8, (a) illustrates the initial state of a solder joint layer by a conventional Sn—Sb-based solder material (hereafter referred to as Sn—Sb-based solder joint layer).

The Sn—Sb-based solder material is a solder material of solid-solution strengthened type. As illustrated in (a) of FIG. 8, Sb forms a solid solution up to about 8.5 wt % (8.3 atom percent (at %)), such that the Sn crystal grains 131 overall are strengthened, in a solder joint layer that utilizes a conventional Sn—Sb-based solder material in Sn crystal grains 131.

Coarsening of the Sn crystal grains 131 arising on account of thermal load in repeated cycles of heat generation and heat dissipation during the operation of a semiconductor device can be suppressed through strengthening of the Sn crystal grains 131 by the Sb in solid solution. Further, Sb in excess of the solid solution limit precipitates partly in the form of a stiff SnSb compound 132 along with part of the Sn in the Sn crystal grains 131. As a result, the crystals deform less readily, and intra-grain cracks progress less readily.

As such a solder material that includes Sn, Ag and Sb, a solder material has been proposed where, in order to enhance the thermal fatigue characteristic of joints, the content of oxygen ($O_2$) as an unavoidable impurity is set to be equal to or smaller than 5 ppm, and the average grain size to be equal to or smaller than 3 μm, in an Sn alloy solder containing one or two of Ag: 1% to 30% and Sb: 0.5% to 25%, with the balance made up substantially of Sn and unavoidable impurities (see, for instance, Japanese Patent Application Publication No. S61-269998).

As yet another solder material, a solder material has been proposed that includes 5 wt % to 15 wt % of Sb and 2 wt % to 15 wt % of Ag, with the balance made up substantially of Sn, excluding unavoidable impurities, and where the surface roughness of the solder material is Ra=10 μm or smaller (see, for instance, Japanese Patent Application Publication No. H07-284983).

As yet another solder material, a solder material has been proposed that is a composite solder material containing a powder in a solder material, where the solder material includes 5 wt % to 15 wt % of Sb and 2 wt % to 15 wt % of Ag, with the balance made up substantially of Sn, excluding unavoidable impurities (see, for instance, Japanese Patent Application Publication No. H08-001372).

As yet another solder material, a solder material has been proposed that is made up of an alloy including 25 wt % to 40 wt % of Ag, 24 wt % to 43 wt % of Sb, and the balance Sn, where the melting temperature of the solder material is set to at least 250° C. or higher (see, for instance, Japanese Patent Application Publication No. 2003-290975).

As yet another solder material, a solder material has been proposed that includes, in mass %, Ag: 0.9% to 10.0%, Al: 0.01% to 0.50%, Sb: 0.04% to 3.00%, such that the ratio Al/Sb satisfies a relationship of being equal to or smaller than 0.25 (excluding 0), the balance being Sn and unavoidable impurities, where the solder material joins a member having oxide or an oxidized surface (see, for instance, Japanese Patent Application Publication No. 2011-005545).

As yet another solder material, a solder material has been proposed that includes 0.05 mass % to 2.0 mass % of Ag, 1.0 mass % or less of copper (Cu), 3.0 mass % or less of Sb, 2.0 mass % or less of bismuth (Bi), 4.0 mass % or less of indium (In), 0.2 mass % or less of nickel (Ni), 0.1 mass % or less of germanium (Ge), 0.5 mass % or less of cobalt (Co) (where, none of Cu, Sb, Bi, In, Ni, Ge, and Co is 0 mass %), and tin as the balance (see, for instance, Japanese Patent No. 4787384).

As yet another solder material, a solder material has been proposed that has a SnSbAgCu substance as a main component, and the composition of the solder material is 42 wt %≤Sb/(Sn+Sb)≤48 wt %, 5 wt %≤Ag<20 wt %, 3 wt %≤Cu<10 wt %, and 5 wt %≤Ag+Cu≤25 wt %, the remainder being unavoidable impurity elements (see, for instance, Japanese Patent No. 4609296).

As yet another solder material, a solder material has been proposed that includes 12 mass % to 16 mass % of Sb, 0.01 mass % to 2 mass % of Ag and 0.1 mass % to 1.5 mass % of Cu, and further includes 0.001 mass % to 0.1 mass % of silicon (Si), and 0.001 mass % to 0.05 mass % of B, with respect to a high-temperature solder material as a whole, the balance being Sn and unavoidable impurities (see, for instance, Japanese Patent No. 4471825).

As yet another solder material, a solder material has been proposed that has, as a main component, a SnSbAgCu substance having a solidus temperature of 225° C., where the constituent ratio of the alloy is 10 wt % to 35 wt % of Ag and Cu, and the weight ratio of Sb/(Sn+Sb) ranges from 0.23 to 0.38 (see, for instance, Japanese Patent Application Publication No. 2005-340268).

As yet another solder material, a solder material has been proposed that has, as a base, an Sn—In—Ag solder alloy including 88 mass % to 98.5 mass % of Sn, 1 mass % to 10 mass % of In, 0.5 mass % to 3.5 mass % of Ag and 0 mass % to 1 mass % of Cu, the Sn—In—Ag solder alloy being doped with a crystallization improver that suppresses growth of an intermetallic phase in the solidified solder (see, for instance, Japanese Translation of PCT Application No. 2010-505625).

As yet another solder material, a solder material has been proposed that includes Ag: 2 mass % to 3 mass %, Cu: 0.3 mass % to 1.5 mass %, Bi: 0.05 mass % to 1.5 mass % and Sb: 0.2 mass % to 1.5 mass %, where the total content of Ag, Cu, Sb and Bi is 5mass% or less, and the balance includes Sn and unavoidable impurities, and the surface properties after reflow are smooth (see, for instance, Japanese Patent Application Publication No. 2002-018590). Reflow is a soldering method where a layer of a solder paste (paste obtained by adding a flux to a solder powder, and adjusted to appropriate viscosity) is formed on a joining material, a component is placed on the solder paste, and thereafter heat is applied to melt the solder.

As yet another solder material, a solder material has been proposed that includes 1 mass % to 3 mass % of Ag, 0.5 mass % to 1.0 mass % of Cu, 0.5 mass % to 3.0 mass % of Bi, 0.5 mass % to 3.0 mass % of In, 0.01 mass % to 0.03 mass % of Ge or 0.01 mass % to 0.1 mass% of selenium (Se), and the balance being Sn (see, for instance, Japanese Patent Application Publication No. 2001-334385).

As yet another solder material, a solder material has been proposed that includes 15.0% to 30.0% of Bi and 1.0% to 3.0% of silver, and depending on the circumstances, optionally 0% to 2.0% of copper, and 0% to 4.0% of Sb and incidental impurities, and the balance being Sn (see, for instance, Japanese Translation of PCT Application No. 2001-520585).

As yet another solder material, a solder material has been proposed that is a Sn—Sb—Ag—Cu quaternary alloy that, with respect to the total, contains proportions of 1.0 wt % to 3.0 wt % of Sb, 1.0 wt % or more but less than 2.0 wt % of Ag, and 1.0 wt % is or less of Cu, with Sn as the balance (see, for instance, Japanese Patent Application Publication No. H11-291083).

As yet another solder material, a solder material has been proposed that contains 3.0 wt % or less of Sb (excluding zero as the range lower limit), 3.5 wt % or less of silver (excluding zero as the range lower limit), 1.0 wt % or less of Ni (excluding zero as the range lower limit), 0.2 wt % or less of phosphorus (P) (excluding zero as the range lower limit), and the balance includes Sn and unavoidable impurities (see, for instance, Japanese Patent No. 3353662).

As yet another solder material, a solder material has been proposed that contains 2.5 wt % to 3.5 wt % of Sb, 1.0 wt % to 3.5 wt % of Ag and 1.0 wt % or less (excluding zero as the range lower limit) of Ni, and the balance includes Sn and unavoidable impurities (see, for instance, Japanese Patent No. 3353640).

As yet another solder material, a solder material has been proposed that includes 0.5 wt % to 3.5 wt % of Ag, 3.0 wt % to 5.0 wt % of Bi, 0.5 wt % to 2.0 wt % of Cu, 0.5 wt % to 2.0 wt % of Sb and the balance being Sn, the solder material being in any one form from among rod-like, wire-like, preform-like or flux-cored solder (see, for instance, Japanese Patent No. 3673021).

As yet another solder material, a solder material has been proposed that includes 0.8 wt % to 5 wt % of Ag, and In and Bi each in an amount of 0.1 wt % or greater, with the total amount of both being 17 wt % or less, and a balance including Sn and unavoidable impurities, and where the solder material has further added thereto 0.1 wt % to 10 wt % of Sb (see, for instance, Japanese Patent Application Publication No. H09-070687).

As yet another solder material, a solder material has been proposed that contains 61 wt % to 69 wt % of Sn, 8 wt % to 11 wt % of Sb, and 23 wt % to 28 wt % of Ag (see, for instance, U.S. Pat. No. 4,170,472).

As yet another solder material, a solder material has been proposed that includes 93 wt % to 98 wt % of Sn, 1.5 wt % to 3.5 wt % of Ag, 0.2 wt % to 2.0 wt % of Cu and 0.2 wt % to 2.0 wt % of Sb, and that has a melting point ranging from 210° C. to 215° C. (see, for instance, U.S. Pat. No. 5,352,407).

As yet another solder material, a solder material has been proposed that includes 90.3 wt % to 99.2 wt % of Sn, 0.5 wt % to 3.5 wt % of Ag, 0.1 wt % to 2.8 wt % of Cu and 0.2 wt % to 2.0 wt % of Sb, and that has a melting point ranging from 210° C. to 216° C. (see, for instance, U.S. Pat. No. 5,405,577).

As yet another solder material, a solder material has been proposed that includes at least 90 wt % of Sn, and an effective amount of Ag and Bi, and that includes optionally Sb, or Sb and Cu (see, for instance, U.S. Pat. No. 5,393,489).

As yet another solder material, a solder material has been proposed that includes 0.5 wt % to 4.0 wt % of Sb, 0.5 wt % to 4.0 wt % of zinc (Zn), 0.5 wt % to 2.0 wt % of Ag and 90.0 wt % to 98.5 wt % of Sn (see, for instance, U.S. Pat. No. 4,670,217).

As yet another solder material, a solder material has been proposed that is a solder paste including a metal component made up of a first metal powder and a second metal powder having a melting point higher than that of the first metal powder, where the first metal is Sn alone, or an alloy including Sn and at least one element selected from the group including Cu, Ni, Ag, gold (Au), Sb, Zn, Bi, In, Ge, Co, manganese (Mn), iron (Fe), chromium (Cr), magnesium (Mg), palladium (Pd), Si, strontium (Sr), tellurium (Te) and P (see, for instance, WO 2011/027659).

Semiconductor devices are subject to thermal load upon repeated heat generation and heat dissipation (power cycling) during operation of the device, and also by thermal load from heat cycles such as changes in environmental temperature or the like (heating and cooling). Deterioration of solder joint layers on account of thermal load derived from such power cycling and the like has conventionally been a problem in semiconductor devices. The life of solder joint layers is one determining factor of the life of semiconductor devices, and it is accordingly necessary to prolong the life of solder joint layers. In order to reduce the size of the semiconductor device as a whole and the size of heat sinks, it is necessary to operate during high-temperature heat generation by the semiconductor device (for instance, 175° C. or higher) and, in particular, to secure the power cycling reliability of power semiconductors at this temperature. Further, semiconductor devices installed in automobiles and semiconductor devices in new energy applications must be long-lived. Consequently, solder materials are required that enable solder joining at a low melting point and that allow forming a solder joint layer of high reliably towards power cycling and the like. Power cycling reliability includes various characteristics of the semiconductor device when the latter is operated and is accordingly subject to a load of a predetermined temperature cycle.

For instance, a Sn3.5Ag solder material (solder material including 96.5 wt % of Sn and 3.5 wt % of Ag) ordinarily used as a conventional Sn—Ag-based solder material described above allows for solder joining at a low melting point (for instance, about 220° C.), but is problematic in terms of reliability during high-temperature operation. When the Ag content in a Sn—Ag-based solder joint layer is increased, as in Japanese Patent Application Publication Nos. S61-269998, H07-284983, H08-001372, 2003-290975, and 2011-005545, material costs increase as well (for instance, a solder cost increase of about 20% for a 1% increase in Ag content), and the melting point becomes higher (for instance, a melting point of about 300° C. in a Sn10Ag solder material (solder material including 90.0 wt % of Sn and 10.0 wt % of Ag)). It is accordingly impractical to increase the Ag content in Sn—Ag-based solder joint layers.

The following problems arise in conventional Sn—Ag-based solder joint layers due to thermal load in power cycling. In FIG. 7, (b) illustrates the state of conventional Sn—Ag-based solder joint layer at the time of a power cycling reliability test (state resulting from being subject to a thermal load from power cycling). In a conventional Sn—Ag-based solder joint layer, Sn crystal grains 121 undergo coarsening on account of thermal load from power cycling, and the $Ag_3Sn$ compound 122 undergoes aggregation and coarsening to a grain size of about 5 μm, as illustrated in (b) of FIG. 7.

Consequently, the crystal grain boundaries between Sn crystal grains 121 are no longer strengthened by the $Ag_3Sn$ compound 122 and, as a result, a grain boundary crack 123 arises at crystal grain boundaries between Sn crystal grains 121. This grain boundary crack 123 progresses to the crystal grain boundaries between adjacent Sn crystal grains 121.

The above-described conventional Sn—Sb-based solder material is problematic in that although the material becomes more reliable as the content of Sb included in the Sn—Sb-based solder material increases, the melting point of the material rises as the content of Sb increases. For instance, the melting point of a Sn13Sb solder material (solder material including 87.0 wt % of Sn and 13.0 wt % of Sb), which is ordinarily used as a conventional Sn—Sb-based solder material, is of about 300° C. When the semiconductor device is operated in an environment of about 175° C., in some cases even higher reliability may be necessary, depending on, for instance, the intended application of the device, even for Sn—Sb-based solder materials for which the reliability has been enhanced through an increase in the content of Sb to bring the melting point of the solder material to about 300° C.

The following problems arise in conventional Sn—Sb-based solder joint layers due to thermal load in power cycling or the like. In FIG. 8, (b) illustrates the state of a conventional Sn—Sb-based solder joint layer at the time of a power cycling reliability test. In conventional Sn—Sb-based solder joint layers, the crystal grain boundaries between Sn crystal grains 131 are not strengthened, as illustrated in (b) of FIG. 8; accordingly, a problem arises in that, when the solder is strained due to stress, a grain boundary crack 133 forms at crystal grain boundaries between Sn crystal grains 131, and this grain boundary crack 133 progresses to the crystal grain boundaries between adjacent Sn crystal grains 131.

Further, reflow thermal treatments of solder pastes are ordinarily performed in an oven, in a nitrogen ($N_2$) atmosphere. Performing thermal treatment at 300° C. or above is however difficult from the viewpoint of the heat resistance of a solder paste (the heat resistance of the resin in the solder paste is about 250° C.) and thus, solder materials having a melting point of about 300° C. are difficult to use in manufacturing processes. Although thermal treatment is possible at 300° C. or above in reflow thermal treatment of solder paste in an oven having a hydrogen ($H_2$) atmosphere, there is a risk of damage to the semiconductor chip as a result of thermal treatment at a temperature of 350° C. or above. Softening of aluminum (Al) and copper used as electrode materials and structural materials, as well as shorter life and shape defects, are further concerns that arise in a case where the thermal treatment is performed for a prolonged period of about 30 minutes, at a temperature of about 300° C.

SUMMARY OF THE INVENTION

To solve the problems associated with the conventional techniques, a semiconductor device and a manufacturing method of a semiconductor device are proposed such that the semiconductor device can be solder-joined at a low melting point and has a highly reliable solder joint layer.

In the semiconductor device, constituent parts in one set thereof are joined by a solder joint layer, the semiconductor device having the following characterizing features. The solder joint layer includes: first crystal sections containing tin and antimony at a ratio of tin atoms:antimony atoms=1:p ($0<p\leq0.1$); and second crystal sections having at least one among a first portion containing tin and silver at a ratio of tin atoms:silver atoms=1:q ($2\leq q\leq 5$) and a second portion containing tin and copper at a ratio of tin atoms:copper atoms=1:r ($0.4\leq r\leq 4$). The average grain size of the second crystal sections is smaller than the average grain size of the first crystal sections.

In the semiconductor device above, the solder joint layer has third crystal sections containing tin and antimony at a ratio of tin atoms:antimony atoms=1:s ($0.8\leq s\leq 1.6$).

In the semiconductor device, the first crystal sections are tin crystal grains with antimony in solid solution.

In the semiconductor device, the first crystal sections are tin crystal grains with antimony in solid solution; and the third crystal sections are crystal grains resulting from a reaction between the first crystal sections and antimony that is in excess of the solid solution limit in the first crystal sections.

In the semiconductor device, the second crystal sections precipitate at crystal grain boundaries between the first crystal sections.

In the semiconductor device, the average grain size of the first portion is 1 μm or less.

In the semiconductor device, the melting point of the solder joint layer is 260° C. or lower.

Furthermore, the manufacturing method of a semiconductor device in which constituent parts in one set thereof are joined by a solder joint layer, includes coating one of the constituent parts with a solder paste that contains a mixture of an alloy powder containing antimony, and an alloy powder containing no antimony; and solidifying the solder paste by a thermal treatment to form the solder joint layer and join the constituent parts to each other by way of the solder joint layer. The solder joint layer contains first crystal sections and second crystal sections. The first crystal sections contain tin and antimony at a ratio of tin atoms: antimony atoms=1:p ($0<p\leq0.1$). The second crystal sections have at least one among a first portion containing tin and silver at a ratio of tin atoms:silver atoms=1:q ($2\leq q\leq5$) and a second portion containing tin and copper at a ratio of tin atoms:copper atoms=1:r ($0.4\leq r\leq4$). The average grain size of the second crystal sections is smaller than the average grain size of the first crystal sections.

Other objects, features, and advantages of the present invention are specifically set forth in or will become apparent from the following detailed description of the invention when read in conjunction with the accompanying drawings.

BRIEF DESCRIPTION OF THE DRAWINGS

FIG. 2 is an explanatory diagram illustrating schematically a configuration of a solder joint layer in FIG. 1;

FIG. 4A is a cross-sectional diagram illustrating a state of a solder joint layer in Comparative Example 1 at the time of a power cycling reliability test;

DETAILED DESCRIPTION OF THE PREFERRED EMBODIMENTS

Preferred embodiments of a semiconductor device and a manufacturing method of a semiconductor device according to the present invention will be described in detail with reference to accompanying drawings. In the description of the embodiments below and accompanying drawings, identical structures are denoted by identical reference symbols, and a recurrent description thereof will be omitted.

Figure 1:
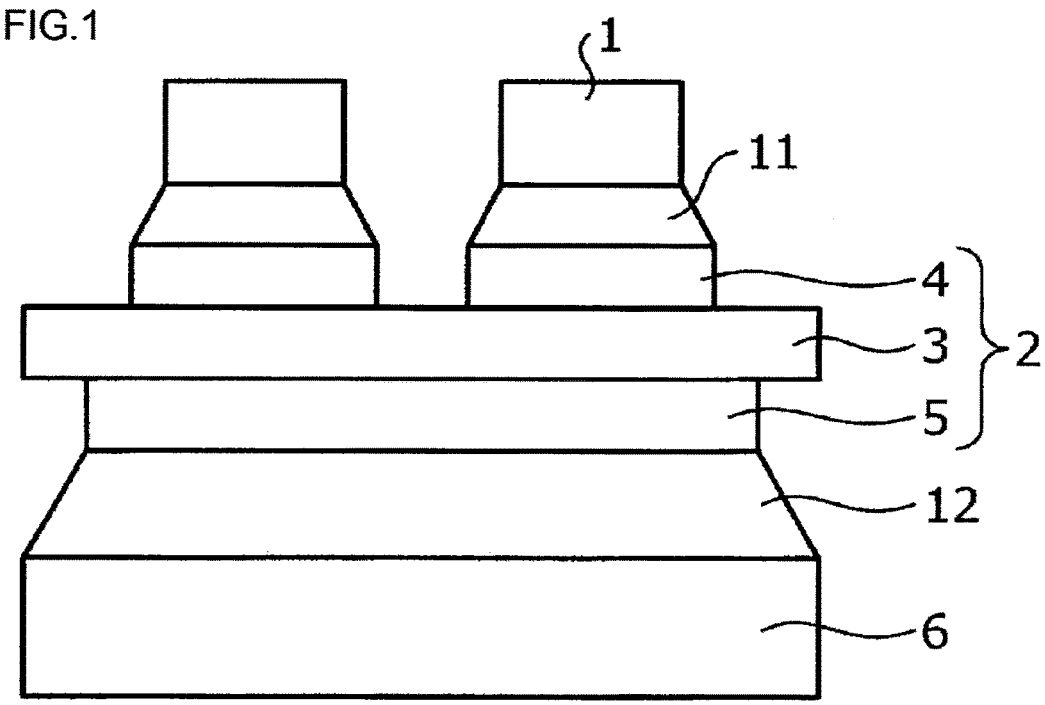
FIG. 1 is a cross-sectional diagram illustrating a structure of a semiconductor device according to an embodiment.

A structure of a semiconductor device according to an embodiment will be described. FIG. 1 is a cross-sectional diagram illustrating a structure of a semiconductor device according to an embodiment. The semiconductor device according to the embodiment is, for instance, a modular-structure semiconductor device that includes a semiconductor chip 1, an insulating substrate 2 such as ceramic insulating substrate (Direct Copper Bonding (DCB) substrate), and a copper (Cu) base 6, as illustrated in FIG. 1. A heat sink, a resin case, outer terminals, bonding wires and so forth have been omitted in FIG. 1. The insulating substrate 2 is provided with, for instance, a circuit pattern (metal foil) 4 including a conductor such as Cu, on the front face side of an insulating layer 3, and is provided with a metal foil, such as a back copper foil 5, on the rear face side.

The rear face of the semiconductor chip 1 and the circuit pattern (metal foil) 4 are joined via a solder joint layer 11. The front face of the Cu base 6 is joined to the back copper foil 5 via a solder joint layer 12. Although not illustrated in the figure, a heat sink is joined to the rear face of the Cu base 6 via a thermal compound. A resin case provided with external terminals is bonded to the peripheral edge of the Cu base 6. An electrode (not shown) provided on the front face of the semiconductor chip 1 and the circuit pattern (metal foil) 4 are electrically connected to each other by wire bonding, for instance by way of aluminum wires not shown.

A method of joining members to be joined by the solder joint layers 11, 12 involves bringing the members to be joined into contact with each other, via a solder paste or the like, and thereafter, performing a thermal treatment, while holding the members to be joined for about 0.5 minutes to 30 minutes, preferably for 1 minute to 5 minutes, at a temperature ranging from about 250° C. to 350° C. Thereafter, cooling at a predetermined temperature decrease rate solidifies the solder paste and forms the solder joint layers. The temperature rise rate in the thermal treatment is about 1° C./sec. Preferably the temperature decrease rate is about 5° C./sec or greater, and ranges more preferably from 8° C./sec to 15° C./sec. In conventional joining methods, the temperature decrease rate in a thermal treatment for forming solder joint layers has been of 1° C./sec, but solder joint layers having a predetermined configuration failed to be obtained and power cycling reliability was poor due to the occurrence of cracks in the solder joint layers.

In the present invention, by contrast, the solder joint layers 11, 12 having a metal structure as described below can be obtained by prescribing the above condition of temperature decrease rate.

The oven environment herein may be a nitrogen atmosphere, a hydrogen atmosphere, etc. The above members to be joined are constituent parts of the semiconductor device, such as the semiconductor chip, the circuit pattern (metal foil) 4, the metal foil (insulating substrate) and the heat spreader (Cu base) and so forth. The constituent parts that are joined are, specifically, the semiconductor chip 1, the circuit pattern (metal foil) 4, the Cu base 6, the back copper foil 5, a lead frame, the metal foil (insulating substrate) and so forth.

The solder joint layers 11, 12 are formed using a cream-like solder paste resulting from mixing a powder of a solder material that includes predetermined materials, at predetermined proportions, and a flux (rosin or the like). It suffices that the solder paste for forming the solder joint layers 11, 12 has appropriate viscosity such that the solder paste wets, and spreads over, a predetermined surface area, and such that the solder paste can be applied onto members to be joined using a dispenser or the like. The solder paste may be a solder paste (hereafter referred to as homogeneous paste) that includes a powder of one type of alloy, or may be a solder paste (hereafter referred to as mixed paste) that includes powders of two or more types of alloy that are adjusted to different compositions. To join members to be joined to each other using the solder paste, for instance the solder paste that yields the solder joint layers 11, 12 is applied onto one of the members to be joined. Thereafter, other members to be joined are disposed on the solder paste, and the solder joint layers 11, 12 are formed through solidification of the solder paste as a result of a thermal treatment. The members to be joined become bonded to and integrated with each other as a result. A material ordinarily used in semiconductors or the like may be used herein as the flux included in the solder paste.

A powder adjusted to a predetermined composition may be used as the powder of the solder material included in the solder paste for forming the solder joint layers 11, 12. For instance, a powder of an 89Sn8Sb3Ag alloy (including 89.0 wt % of Sn, 8.0 wt % of Sb, and 3.0 wt % of Ag) may be used in a case where, for instance, the solder joint layers 11, 12 are formed using the 89Sn8Sb3Ag solder material (i.e. formation of a homogeneous paste). As the powder of the solder material included in the solder paste for forming the solder joint layers 11, 12, a mixture of powders of two or more alloy types adjusted to different compositions (i.e., formation of a mixed paste) may be used. For a powder mixture of two or more types of alloy, a solder paste may be used resulting from mixing a first powder including Sb and a second powder including no Sb, at a predetermined weight ratio. Specifically, for instance, a first powder of an 81.5Sn16Sb2.5Ag alloy (alloy including 81.5 wt % of Sn, 16.0 wt % of Sb and 2.5 wt % of Ag), and a second powder of a 96.5Sn3.5Ag alloy (alloy including 96.5 wt % of Sn and 3.5 wt % of Ag), at a weight ratio of 1:1 are mixed to yield a solder paste. The solder joint layers 11, 12 of the 89Sn8Sb3Ag alloy can be formed by subjecting this solder paste to a thermal treatment.

The configuration of the solder joint layers 11, 12 will be described in detail. FIG. 2 is an explanatory diagram illustrating schematically a configuration of the solder joint layer in FIG. 1. In FIG. 2, (a) illustrates an initial state (before application of a thermal load from power cycling) of the solder joint layers 11, 12. The solder joint layers 11, 12 are formed in by a common solder joining method using a solder material that includes predetermined amounts of tin (Sn), antimony (Sb), and silver (Ag). The solder joint layers 11, 12 may further contain Cu at a predetermined proportion. In this case, the solder joint layers 11, 12 may be formed using a solder material that includes predetermined amounts of Sn, Sb, Ag and Cu. Solder wettability can be enhanced by the inclusion of Ag in the solder joint layers 11, 12.

As illustrated in (a) of FIG. 2, the solder joint layers 11, 12 have a structure in which plural second crystal sections (crystal grains) 22 having, for instance, a fine-grained or columnar shape, precipitate at crystal grain boundaries between the first crystal sections 21 that are dispersed as a matrix, such that the second crystal sections 22 are harder and have a smaller grain size (diameter) than the first crystal sections 21. The first crystal sections 21 are Sn crystal grains that include Sn and Sb, with the amount of Sb atoms with respect to Sn atoms being greater than 0 up to the solid solution limit, for instance a ratio of Sn atoms:Sb atoms=1:p ($0<p\leq0.1$), such that the crystal grains overall are solid-solution strengthened by Sb that forms a solid solution in the first crystal sections 21, and the crystals of the first crystal sections 21 do not deform readily.

The crystal grain boundaries between the first crystal sections 21 are strengthened, and crystals do not deform readily, through precipitation of the plural second crystal sections 22 at crystal grain boundaries between the first crystal sections 21. The ratio of Sn atoms:Sb atoms is the ratio of the number of atoms of Sn and Sb. From the viewpoint of reliability, the average grain size of the first crystal sections 21 preferably ranges from 0.2 μm to 100 μm. The reason for this is that a grain size close to 0.2 μm for the first crystal sections 21 affords resistance against thermal load, whereas, when the average grain size exceeds 100 μm, voids occur and for instance, thermal properties and mechanical properties become uneven, as a result of which reliability may decrease. A further reason is that the second crystal sections 22 are formed readily at the crystal grain boundaries between the first crystal sections 21 in a case where the average grain size of the first crystal sections 21 lies within the above range.

The second crystal sections 22 are a first intermetallic compound (first portion) 22-1 that includes Sn and Ag at a ratio for instance of Sn atoms:Ag atoms=1:q ($2\leq q\leq5$). Among plural first intermetallic compounds 22-1, the average grain size of most of the first intermetallic compounds 22-1 is preferably 10 μm or smaller, and ranges preferably from 0.1 μm to 1.0 μm, from the viewpoint of reliability. A greater content of the first intermetallic compound 22-1 having a grain size of 1 μm or smaller in the solder joint layers 11, 12 is preferable, since, accordingly, the strengthening mechanism at the crystal grain boundaries between the first crystal sections 21 becomes more pronounced.

The Ag content in the second crystal sections 22 varies depending on, for instance, the content of Sb in the solder material, and the presence of other atoms during solder joining. The first intermetallic compounds 22-1 are for instance an $Ag_3Sn$ (Sn atoms:Ag atoms=1:3) compound or an $Ag_4Sn$ (Sn atoms:Ag atoms=1:4) compound including Ag and Sn.

The second crystal sections 22 are present at crystal grain boundaries between the first crystal sections 21, and have a portion at which the first crystal sections 21 are connected to each other via the second crystal sections 22. A portion may be present at which the first crystal sections 21 form a direct interface with each other. The second crystal sections 22 may be formed between the member to be joined and the first crystal sections 21, or may be formed between the first crystal sections 21 and other second crystal sections 22 of different composition. Further, the second crystal sections 22 may be formed between third crystal sections 23 described below, or between the third crystal sections 23 and the first crystal sections 21, or between the third crystal sections 23 and the member to be joined. Through formation of the second crystal sections 22, cracks occur less readily at crystal grain boundaries of the first crystal sections 21, indicating that the crystal grain boundaries of the first crystal sections 21 are strengthened.

The proportion of the surface area of the first intermetallic compound 22-1 with respect to the surface area of the first crystal sections 21 (hereafter referred to as surface area ratio S1 of the first intermetallic compound 22-1) may be for instance greater than 0%, up to 5% (0%<S1≤5%). An effect of preventing progress of grain boundary cracks is obtained by setting the surface area ratio S1 of the first intermetallic compound 22-1 to be greater than 0%. Preferably, the surface area ratio S1 of the first intermetallic compound 22-1 may range, for instance, from 2% to 5% (2%≤S1≤5%). The reasons for this are as follows. By prescribing the surface area ratio S1 of the first intermetallic compound 22-1 to be equal to or greater than 2%, the first crystal sections 21 can be covered, substantially completely, by the first intermetallic compound 22-1, and accordingly, it becomes possible to enhance the effect of preventing the progress of grain boundary cracks. A further reason is that when the surface area ratio S1 of the first intermetallic compound 22-1 is greater than 5%, the grain size of the first intermetallic compound 22-1 (for instance, the $Ag_3Sn$ compound) increases and as a result, the effect of preventing the progress of grain boundary cracks is weakened. The surface area ratio and the average grain size are calculated through image processing, over a region sufficiently larger than the grain size of the first crystal sections 21 (for instance a 30 μm×30 μm region) of, for instance, Scanning Electron Microscope (SEM) images at a magnification of 1500×, which allows discriminating a grain size of about 1 μm of the first intermetallic compound 22-1. More specifically, the outline of the grain is made distinct by image processing, to recognize predetermined grains. The surface area and grain size of the grains are then obtained through approximation to circles, polygons or the like.

The second crystal sections 22 may be a second intermetallic compound (second portion) 22-2 that includes Sn and Cu at a ratio of, for instance, Sn atoms:Cu atoms=1:r (0.4≤r≤4). The second crystal sections 22 may be made up of the first intermetallic compound 22-1 and the second intermetallic compound 22-2. The second intermetallic compound 22-2 is for instance a $Cu Sn_5$ (Sn atoms:Cu atoms=5:6) compound or a $Cu_3Sn$ (Sn atoms:Cu atoms=1:3) compound. The $Cu_3Sn$ compound in the second crystal sections 22 is formed through reaction between Cu that is molten in the solder joint layers 11, 12, from a Cu member (circuit pattern 4 or back copper foil 5), and Sn (for instance, first crystal sections 21). The $Cu_3Sn$ compound is generated for instance through thermal treatment over a reaction time lasting 0.5 minutes to 30 minutes, preferably 1 minutes to 5 minutes, at a temperature ranging from 250° C. to 350° C. The $Cu_3Sn$ compound is present in the vicinity of the Cu member, within the solder joint layers 11, 12. The temperature decrease rate in the thermal treatment at the time where the $Cu_3Sn$ compound is generated is preferably 5° C./sec or higher, and more preferably ranges from 8° C./sec to less than 15° C./sec.

In some instances, the $Cu_3Sn$ compound is formed not only in the vicinity of the Cu member but throughout the solder joint layers 11, 12, by diffusion of Cu, depending on the thermal load from power cycling (change of temperature in one cycle from room temperature (e.g., 25° C.) up to 175° C.). The second intermetallic compound 22-2 is likewise generated by thermal load from power cycling in which the temperature in one cycle changes from room temperature to a temperature in the range of 150° C. to 250° C. The underlying reasons are deemed to be as follows. The temperature decrease rate of a semiconductor device upon repeated switching on and off lies in a range of 5° C./sec to 10° C./sec. It is deemed that, as a result, the holding temperature and the rapid cooling conditions in the power cycling test are appropriate for the generation of the second intermetallic compound 22-2 (Cu—Sn compound) which is the second portion of the second crystal sections 22.

As generation of the second intermetallic compound 22-2 progresses, the Sb concentration in the first crystal sections 21 rises due to the consumption of Sn in the first crystal sections 21. As a result, the first crystal sections 21 are strengthened to a greater degree than in a case of simple solder, and the third crystal sections 23 further described hereinafter are newly generated (if already present, then the number of third crystal sections 23 increases), all of which elicits a reliability enhancement effect. An effect similar to that elicited when using Cu is achieved herein by using, besides Cu, also another material that forms compounds with Sn, for instance nickel (Ni), gold (Au) and Ag, as the surface of members to be joined by the solder joint layers 11, 12. Preferably, the average grain size of the second intermetallic compound 22-2 is 10 μm or smaller, and ranges preferably from 0.1 μm to 1.0 μm, from the viewpoint of reliability.

Accordingly, after solder joining by the solder joint layers 11, 12, it is preferable to generate the second intermetallic compound 22-2 by performing a thermal treatment before actual use. The thermal load at the time of this thermal treatment involves one or more repetitions, every several seconds to every several minutes, of one cycle in which the temperature changes from room temperature to a temperature within the range from 150° C. to 250° C. The thermal treatment may involve maintaining a temperature within the range from 150° C. to 250° C., for several minutes. Preferably, the temperature decrease rate in this thermal treatment is about 5° C./sec or greater, and ranges more preferably from 8° C./sec to less than 15° C./sec. A temperature decrease rate of 15° C./sec or greater is undesirable in the thermal treatment, since it gives rise to thermal stress in other members, and between members. Air cooling or a coolant may be used to perform such a rapid cooling process.

The proportion of the surface area of the second intermetallic compound 22-2 with respect to the surface area of the first crystal sections 21 (hereafter referred to as surface area ratio S2 of the second intermetallic compound 22-2) may be, for instance, greater than 0% up to 50% (0%<S2≤50%). The reasons for this are as follows. The greater the surface area ratio S2 of the second intermetallic compound 22-2, the more pronounced is the effect that can be achieved of preventing the progress of the grain boundary cracks. A further reason is that when the surface area ratio S2 of the second intermetallic compound 22-2 is greater than 50%, solderability is impaired because the second intermetallic compound 22-2 becomes a hindrance and voids (bubbles) in the solder that melts during solder joining can no longer escape readily.

Therefore, the surface area ratio of the first crystal sections 21 and the second crystal sections 22 is preferably greater than 2% up to 55%.

The solder joint layers 11, 12 may have the third crystal sections 23 that result from a reaction between the first crystal sections 21 and Sb in excess of the solid solution limit, in the first crystal sections 21. The third crystal sections 23 are crystal grains that include Sn and Sb, for instance, at a ratio of Sn atoms:Sb atoms=1:s ($0.8 \leq s \leq 1.6$). More specifically, the third crystal sections 23 are an intermetallic compound, such as a SnSb (Sn atoms:Sb atoms=1:1) compound or a $Sb_2Sn_3$ (Sn atoms:Sb atoms=3:2) compound, harder than the first crystal sections 21. The solid solution limit (saturating amount) of Sb with respect to the Sn crystal grains varies depending on, for instance, the thermal treatment temperature and the cooling temperature at the time of solder joining, the content of Sb in the solder material, and the presence of other atoms at the time of solder joining. Preferably, the average grain size of the third crystal sections 23 ranges from 0.1 μm to 100 μm, from the viewpoint of reliability. This can be ascribed to the same reasons as in the case of the first crystal sections 21. A grain size of the third crystal sections 23 larger than 100 μm is undesirable, since, in that case, solderability is impaired because the third crystal sections 23 become a hindrance and voids in the solder that melts during solder joining can no longer escape readily.

The proportion of the surface area of the third intermetallic compound 23 with respect to the surface area of the first crystal sections 21 (hereafter referred to as surface area ratio S3 of the third intermetallic compound 23) may be for instance greater than 0% up to 15% (0%<S3≤15%). The reasons for this are as follows. The greater the surface area ratio S3 of the third intermetallic compound 23, the more pronounced is the effect that can be achieved of preventing the progress of the grain boundary cracks. A surface area ratio S3 of the third crystal sections 23 greater than 15% is undesirable, since in that case solderability is impaired because the third crystal sections 23 become a hindrance and voids in the solder that melts during solder joining can no longer escape readily. Good compositions have been revealed in composition analysis by Energy-Dispersive X-Ray Spectrometry (EDX), Auger Electron Spectroscopy (AES) and the like, performed on plural cross-sections of actual first crystal sections 21, second crystal sections 22 and third crystal sections 23.

In FIG. 2, (b) illustrates the state of the solder joint layers 11, 12 having such a configuration at the time of a power cycling reliability test (state resulting from being subject to a thermal load from power cycling).

The power cycling reliability test was performed through repeated energization with a current-on time of 0.5 seconds to 3 seconds and a current-off time of 0.5 seconds to 20 seconds, under a condition where the temperature during one cycle varied from room temperature up to 175° C. consequent to heat generation (test time: 50 hours).

Figure 9:
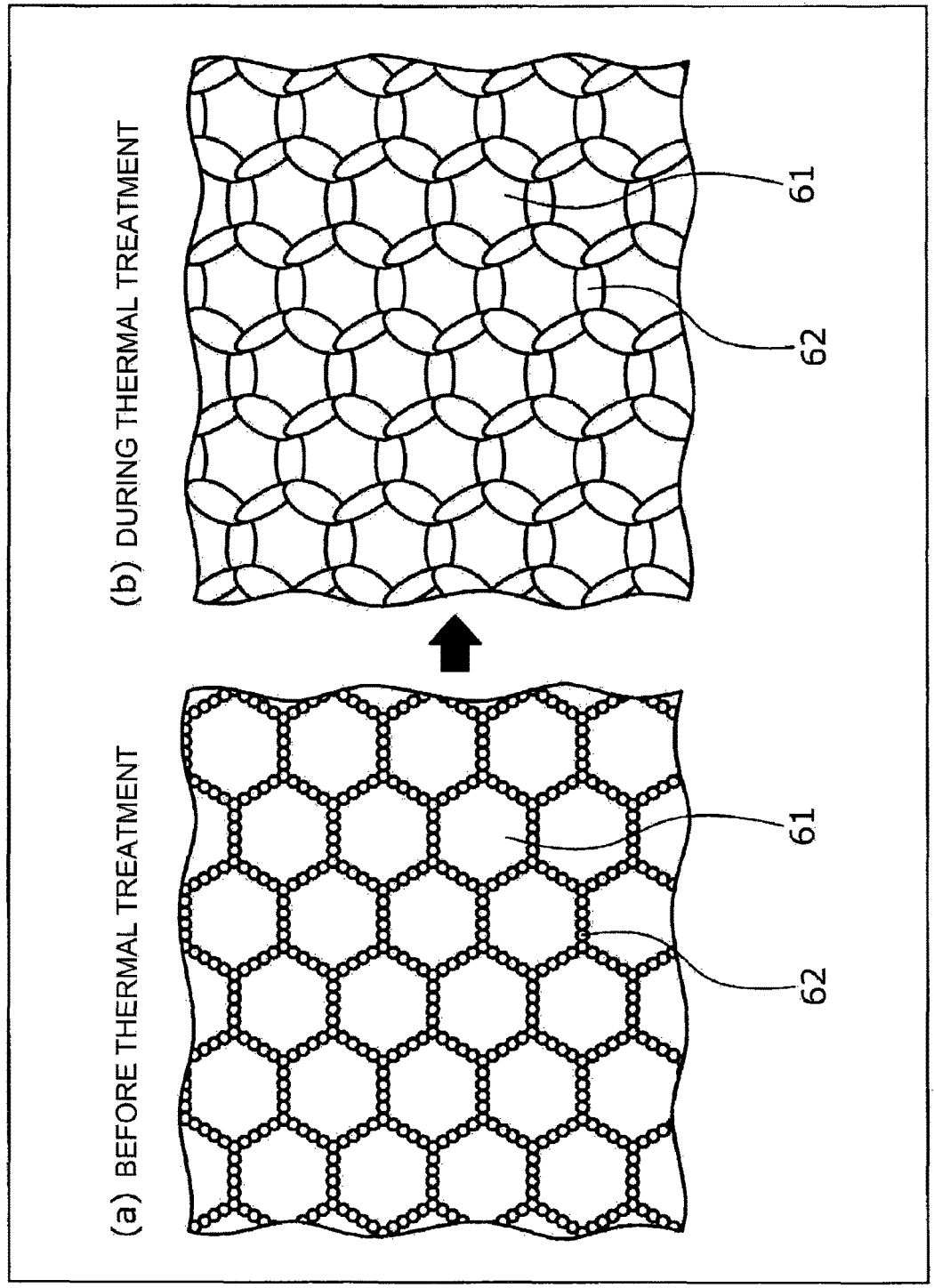
FIG. 9 is an explanatory diagram illustrating schematically a state, at the time of melting, of a homogeneous paste for forming the solder joint layer in FIG. 1.

As described above, the entire first crystal sections 21 undergo solid solution strengthening by the Sb in solid solution and, accordingly, the first crystal sections 21 exhibit no coarsening even when subject to a thermal load from power cycling. Therefore, the precipitation strengthening mechanism at crystal grain boundaries between the first crystal sections 21, elicited by the second crystal sections 22, does not collapse. Even if a grain boundary crack or intra-grain crack (hereafter referred to as crack 24) is generated at one first crystal section 21, as illustrated in (b) of FIG. 2, it becomes accordingly possible to reduce the progress of the crack 24 in the first crystal sections 21 that are contiguous to the first crystal section 21 in which the crack 24 has occurred, as well as the progress of the crack 24 at crystal grain boundaries between the first crystal sections 21. The melting mechanism of the solder paste for forming the solder joint layers 11, 12 will be described. The melting mechanism of a homogeneous paste will be described first. FIG. 9 is an explanatory diagram illustrating schematically a state, at the time of melting, of a homogeneous paste for forming the solder joint layer in FIG. 1. In FIG. 9, (a) illustrates the state of the homogeneous paste before a thermal treatment, and (b) in FIG. 9 illustrates the state of the homogeneous paste during a thermal treatment. As illustrated in (a) of FIG. 9, the homogeneous paste before the thermal treatment has a configuration where, for instance, plural $Ag_3Sn$ compounds 62 having for instance a fine-grained to columnar shape and having a grain size (diameter) smaller than that of 92Sn8Sb crystal grains 61 (crystal grains including 92.0 wt % of Sn and 8.0 wt % of Sb) that are dispersed in a matrix, are precipitated at crystal grain boundaries between the 92Sn8Sb crystal grains 61. The homogeneous paste includes only one type of alloy powder and, accordingly, the structure made up of the above-described 92Sn8Sb crystal grains 61 and the $Ag_3Sn$ compounds 62 is distributed homogeneously throughout the homogeneous paste.

Figure 10:
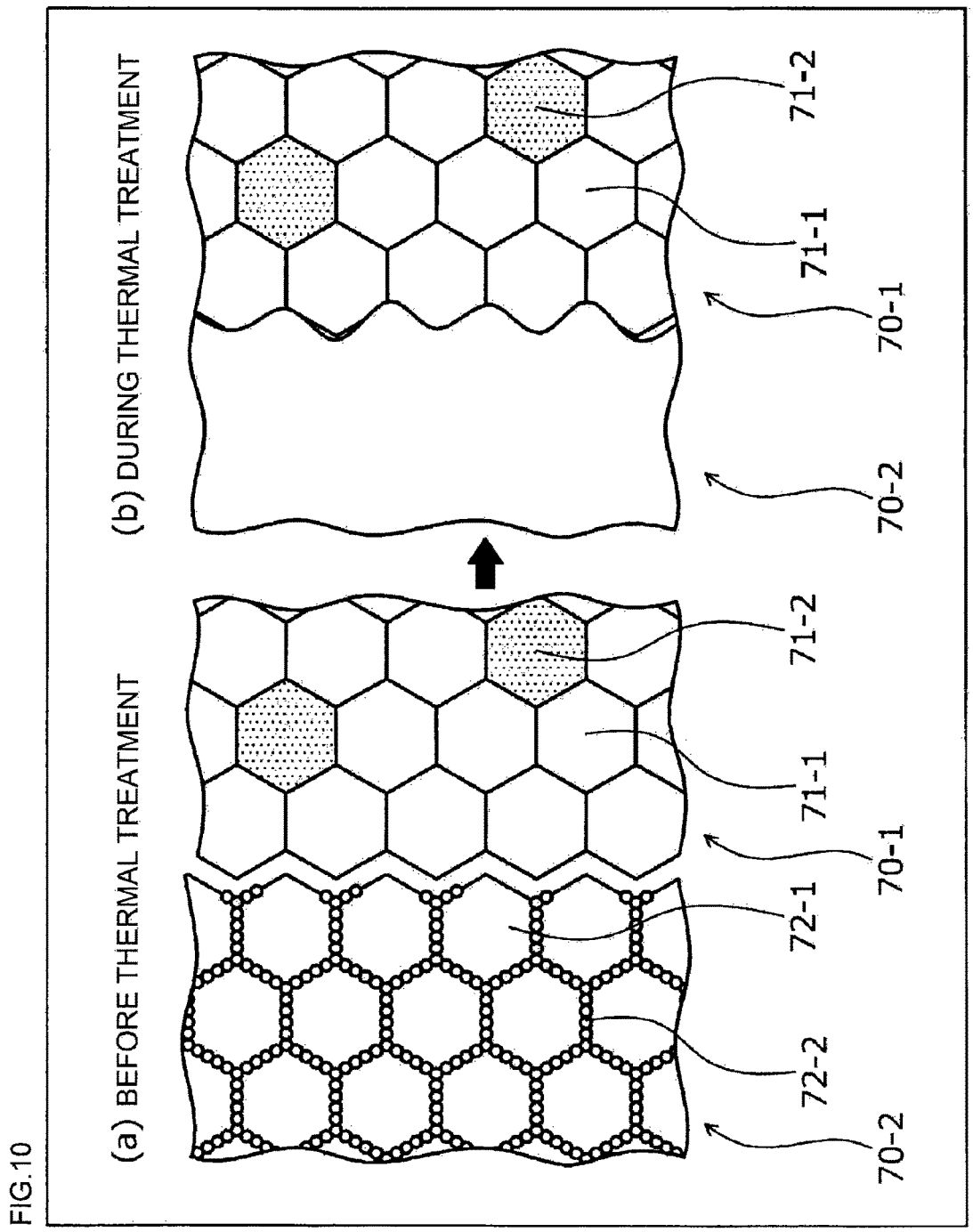
FIG. 10 is an explanatory diagram illustrating schematically a state, at the time of melting, of a mixed paste for forming the solder joint layers of FIG. 1.

When the homogeneous paste is subjected to a thermal treatment for forming the solder joint layers 11, 12, portions of low Sb concentration, i.e. the $Ag_3Sn$ compounds 62 that include no Sb of high melting point, are the first to melt, as illustrated in (b) of FIG. 9, when the temperature of the thermal treatment reaches for instance of about $(221+\alpha)°$ C. The $Ag_3Sn$ compounds 62 are present in a state of being partly dispersed throughout the homogeneous paste; accordingly, the apparent melting point of the homogeneous paste as a whole exhibits virtually no change with respect to the melting point of the 92Sn8Sb crystal grains 61, even though the $Ag_3Sn$ compounds 62 melt sooner than the 92Sn8Sb crystal grains 61. In the case of a homogeneous paste, therefore, the temperature of the thermal treatment reaches the melting point of the $Ag_3Sn$ compounds 62, whereupon the $Ag_3Sn$ compounds 62 melt. Thereafter overall liquefaction occurs when the temperature reaches the melting point of the 92Sn8Sb crystal grains 61. The occurrence of voids in the homogeneous paste is a concern if the thermal treatment time is short. Prolonging the thermal treatment time favors wetting and spreading of the homogeneous paste. Accordingly, it is preferable to set a thermal treatment time such that no voids occur. For instance, virtually no voids are observed to occur in the solder joint layers 11, 12 that utilize the homogeneous paste in a case where the thermal treatment is performed at an oven temperature of 260° C. (235° C. as the temperature of a heating plate on which a semiconductor chip is placed), in a nitrogen atmosphere, for about 270 seconds or longer. The melting mechanism of a mixed paste will be described. FIG. 10 is an explanatory diagram illustrating schematically a state, at the time of melting, of a mixed paste for forming the solder joint layers in FIG. 1. In FIG. 10, (a) illustrates the state of the mixed paste before a thermal treatment, and (b) in FIG. 10 illustrates the state of the mixed paste during a thermal treatment. As illustrated in (a) of FIG. 10, the mixed paste includes a first powder 70-1 and a second powder 70-2, in a separated state, at a predetermined weight ratio. The first powder 70-1 is a powder including Sb and has, for instance, a structure in which Sn crystal grains 71-1 with Sb in solid solution are dispersed in a matrix. Reference symbol 71-2 denotes a SnSb compound in which Sb in excess of the solid solution limit precipitates along with part of the Sn in the Sn crystal grains 71-1. The second powder 70-2 is a powder including no Sb and having, for instance, a structure in which plural $Ag_3Sn$ compounds 72-2 having a fine-grained to columnar shape and having a grain size smaller than that of Sn crystal grains 72-1 dispersed in a matrix, are precipitated at crystal grain boundaries between the Sn crystal grains 72-1.

When the mixed paste is subjected to a thermal treatment for forming the solder joint layers 11, 12, portions of low Sb concentration, i.e., the second powder 70-2 that includes no Sb of high melting point, are the first to melt and liquefy, as illustrated in (b) of FIG. 10, when the temperature of the thermal treatment reaches for instance about 221° C. That is, the entirety of the second powder 70-2 liquefies, whereupon part of the mixed paste is brought to a liquefied state. The second powder 70-2 that has melted first diffuses (not shown in the figures) into the first powder 70-1, and the mixed paste as a whole liquefies in a shorter time than the homogeneous paste does. Thus, the apparent melting point of the mixed paste as a whole drops consequent to the second powder 70-2, which has a lower melting point since it includes no Sb. The wettability of the mixed paste is enhanced through liquefaction in a shorter time than in the case where a homogeneous paste is used. As a result, the occurrence of voids can be suppressed to a greater degree than is the case when a homogeneous paste is used. For instance, voids occur substantially throughout the solder joint layers 11, 12 that utilize a homogeneous paste in a case where the thermal treatment is performed at an oven temperature of 260° C. (235° C. as the temperature of a heating plate on which a semiconductor chip is placed), in a nitrogen atmosphere, for about 110 seconds. By contrast, virtually no voids are observed to occur in solder joint layers 11, 12 that utilize a mixed paste.

Figure 3A:
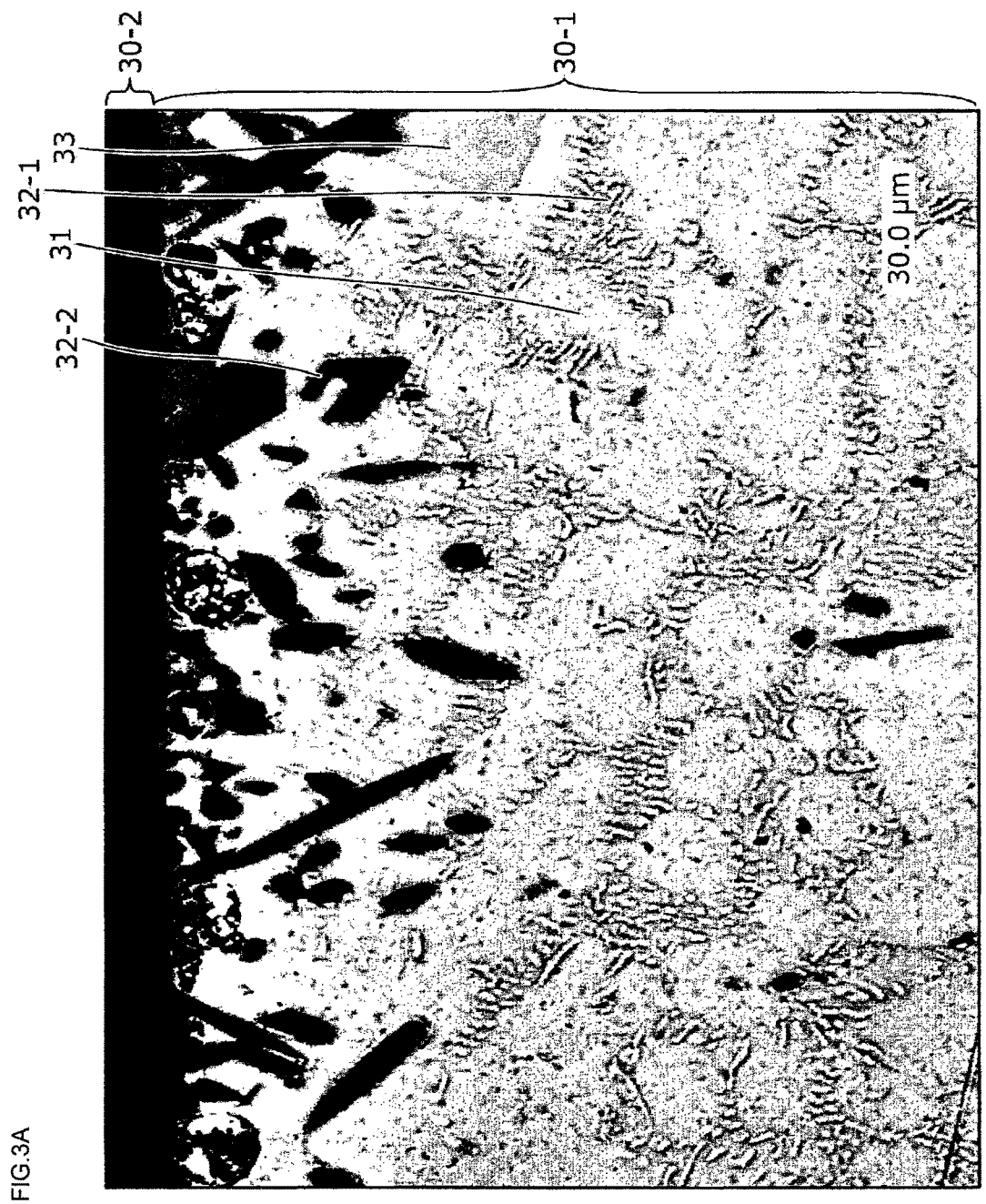
FIG. 3A is a cross-sectional diagram illustrating a state of a solder joint layer in Example 1 at the time of a power cycling reliability test.
Figure 3B:
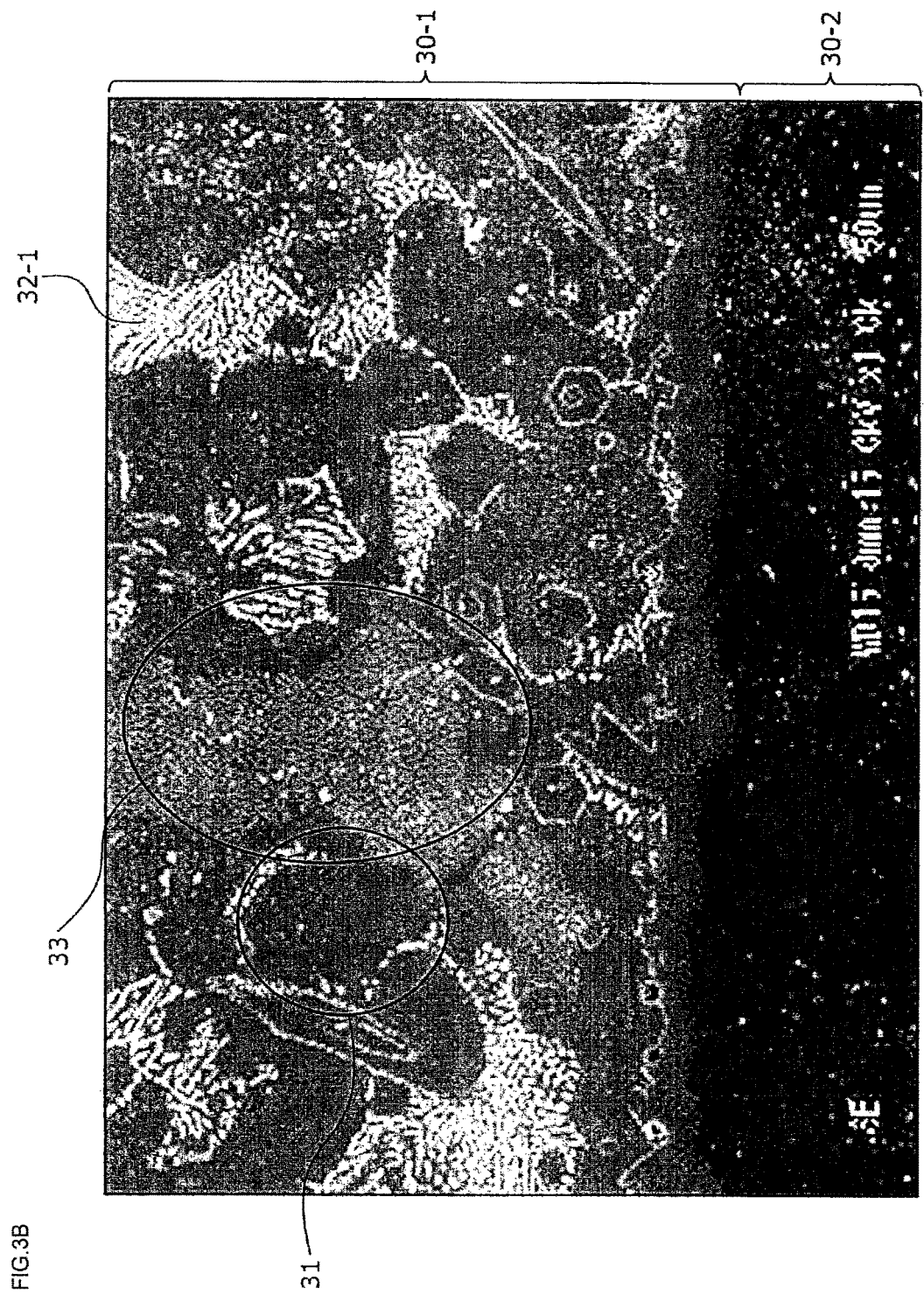
FIG. 3B is a cross-sectional diagram illustrating a state of a solder joint layer in Example 3 at the time of a power cycling reliability test.
Figure 4B:
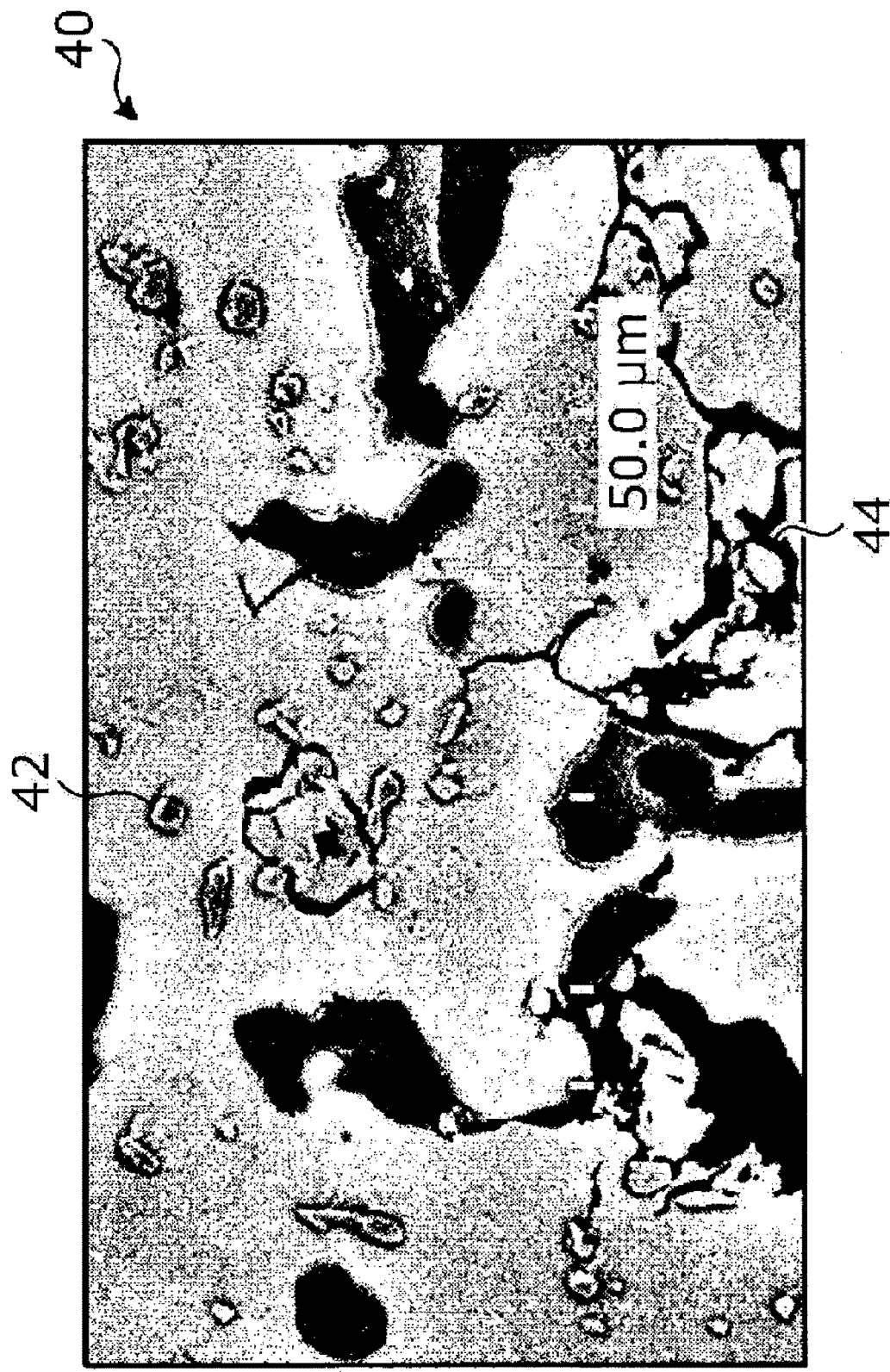
FIG. 4B is a cross-sectional diagram illustrating a state of a solder joint layer in Comparative Example 2 at the time of a power cycling reliability test.

The solder joint layers 11, 12 described above were checked on the basis of a power cycling reliability test. An explanation follows first on the results of the power cycling reliability test in a case where the solder joint layers 11, 12 were formed using a homogeneous paste. For instance, solder joint layers 11, 12 having a thickness of 100 μm were formed by solder joining using a homogeneous paste including a 89Sn8Sb3Ag solder material (solder material including 89.0 wt % of Sn, 8.0 wt % of Sb and 3.0 wt % of Ag, melting point about 253° C.) (i.e. a homogeneous paste including a powder of 89Sn8Sb3Ag alloy, hereafter referred to as a homogeneous paste including a solder material), and the state of the solder joint layers 11, 12 at the time of a power cycling reliability test was observed. The results are illustrated in FIG. 3A (hereafter, Example 1). The temperature in the thermal treatment of Example 1 was set to 270° C., the hold time to 5 minutes, and the temperature decrease rate to 10° C./sec. Solder joint layers 11, 12 were formed by solder joining using a homogeneous paste including a 84Sn13Sb3Ag solder material (solder material including 84.0 wt % of Sn, 13.0 wt % of Sb and 3.0 wt % of Ag, melting point about 290° C.), and the state of the solder joint layers 11, 12 at the time of a power cycling reliability test was observed. The results are illustrated in FIG. 3B (hereafter, Example 3). The temperature in the thermal treatment of Example 3 was set to 320° C., the hold time to 5 minutes, and the temperature decrease rate to 10° C./sec. As Comparative Example 1, a solder joint layer was formed by solder joining using a homogeneous paste including a conventional 87Sn13Sb solder material (solder material including 87.0 wt % of Sn and 13.0 wt % of Sb, melting point about 300° C.), and the state of the solder joint layer at the time of a power cycling reliability test was observed. The results are depicted in FIG. 4A. The temperature in the thermal treatment of Comparative Example 1 was set to 320° C., the hold time to 5 minutes, and the temperature decrease rate to 10° C./sec. FIG. 3A is a cross-sectional diagram illustrating the state of the solder joint layer of Example 1 at the time of the power cycling reliability test. FIG. 3B is a cross-sectional diagram illustrating the state of the solder joint layer of Example 3 at the time of the power cycling reliability test. FIG. 4A is a cross-sectional diagram illustrating the state of solder joint layer of Comparative Example 1 at the time of the power cycling reliability test. FIGS. 3A, 3B, 4A are SEM images observed from the semiconductor chip surface (the same applies to FIGS. 4B, 11, 12).

As illustrated in FIG. 3A, plural Sn crystal grains 31 having Sb in solid solution were observed to be dispersed, as a matrix, in a solder joint layer 30-1 of Example 1, and precipitation was observed of a fine-grained and hard $Ag_3Sn$ compound 32-1 (first intermetallic compound of second crystal sections) having a grain size equal to or smaller than 0.5 μm, so as to surround the Sn crystal grains 31 (average grain size about 30 μm) at crystal grain boundaries between Sn crystal grains 31 (first crystal sections). It was found that one or more Sn crystal grains 31 reacted with Sb in excess of the solid solution limit, to yield a SnSb compound 33 (third crystal sections), while a $Cu Sn_5$ compound 32-2 (second intermetallic compound of the second crystal sections) was observed to precipitate in the vicinity of the joining interface between the solder joint layer 30-1 and a Cu member 30-2. This $Cu Sn_5$ compound 32-2 is formed during solder joining (for instance, thermal treatment at a temperature of 270° C. for about 5 minutes). As a result, the first intermetallic compound and the second intermetallic compound of the second crystal sections are formed so as to surround one or plural first crystal sections. Part of the second crystal sections are formed as a result of having been subject to a thermal load from power cycling (change of temperature during one cycle from room temperature to 175° C.). It was found that further thermal load from power cycling did not result in coarsening of the grain size of the Sn crystal grains 31, or in collapse of the precipitation strengthening mechanism at the crystal grain boundaries between the Sn crystal grains 31, as elicited by the $Ag_3Sn$ compound 32-1, the $Cu Sn_5$ compound 32-2 and the SnSb compound 33, nor were cracks observed to occur. The second intermetallic compound of the second crystal sections is likewise generated by thermal load from power cycling in which the temperature in one cycle changes from room temperature to a temperature in the range of 150° C. to 250° C. As illustrated in FIG. 3B, in Example 3 as well, the Sn crystal grains 31, the $Ag_3Sn$ compound 32-1 and the SnSb compound 33 were observed to precipitate, as in the case of Example 1. On the other hand, no second crystal sections were present in the solder joint layer 40 of Comparative Example 1 and, accordingly, the occurrence of cracks 44 was observed (FIG. 4A) at crystal grain boundaries between Sn crystal grains 41, as a result of solder strain brought about by thermal stress.

Figure 11:
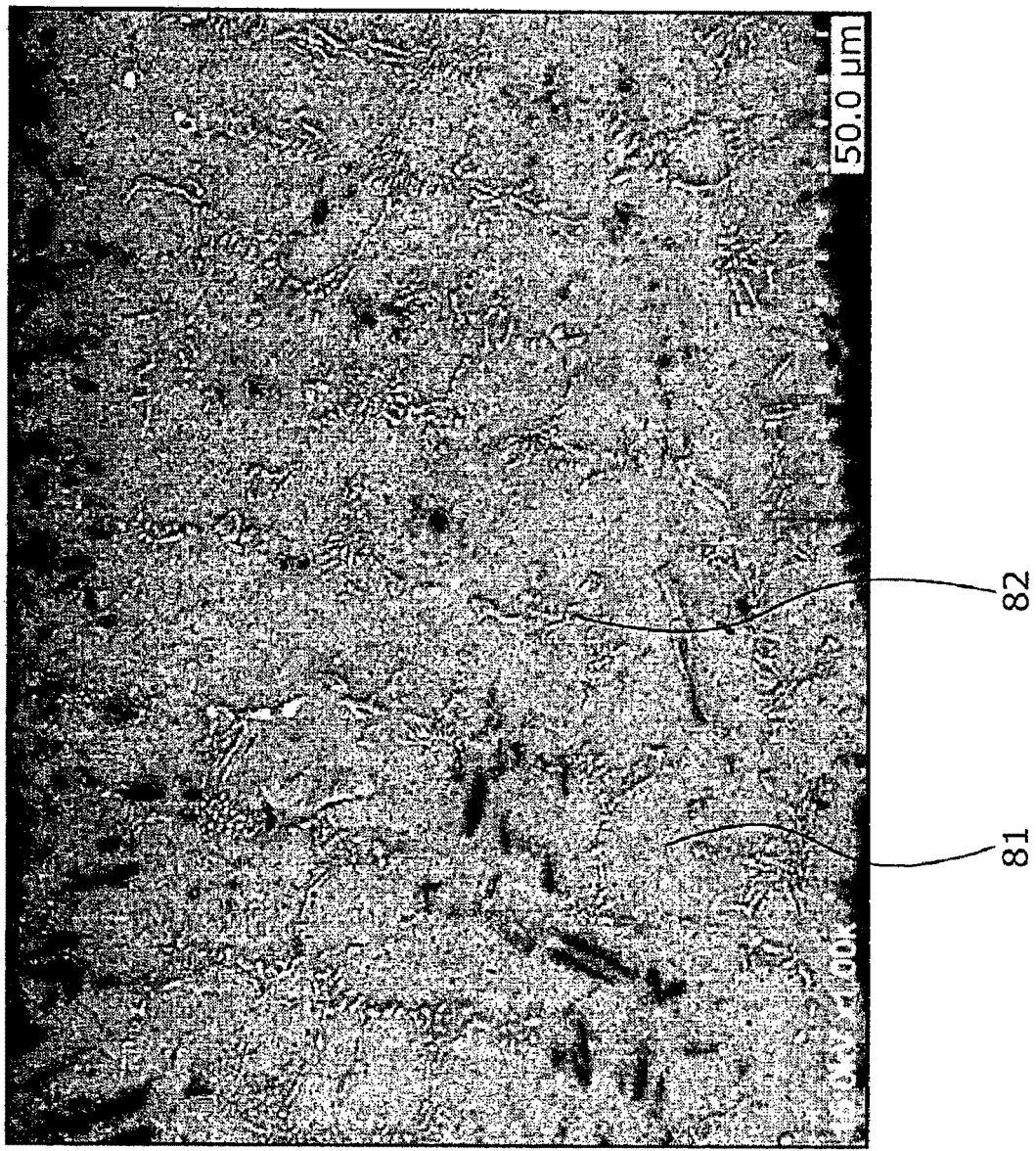
FIG. 11 is a cross-sectional diagram illustrating a state of a solder joint layer in Example 4 at the time of a power cycling reliability test.
Figure 12:
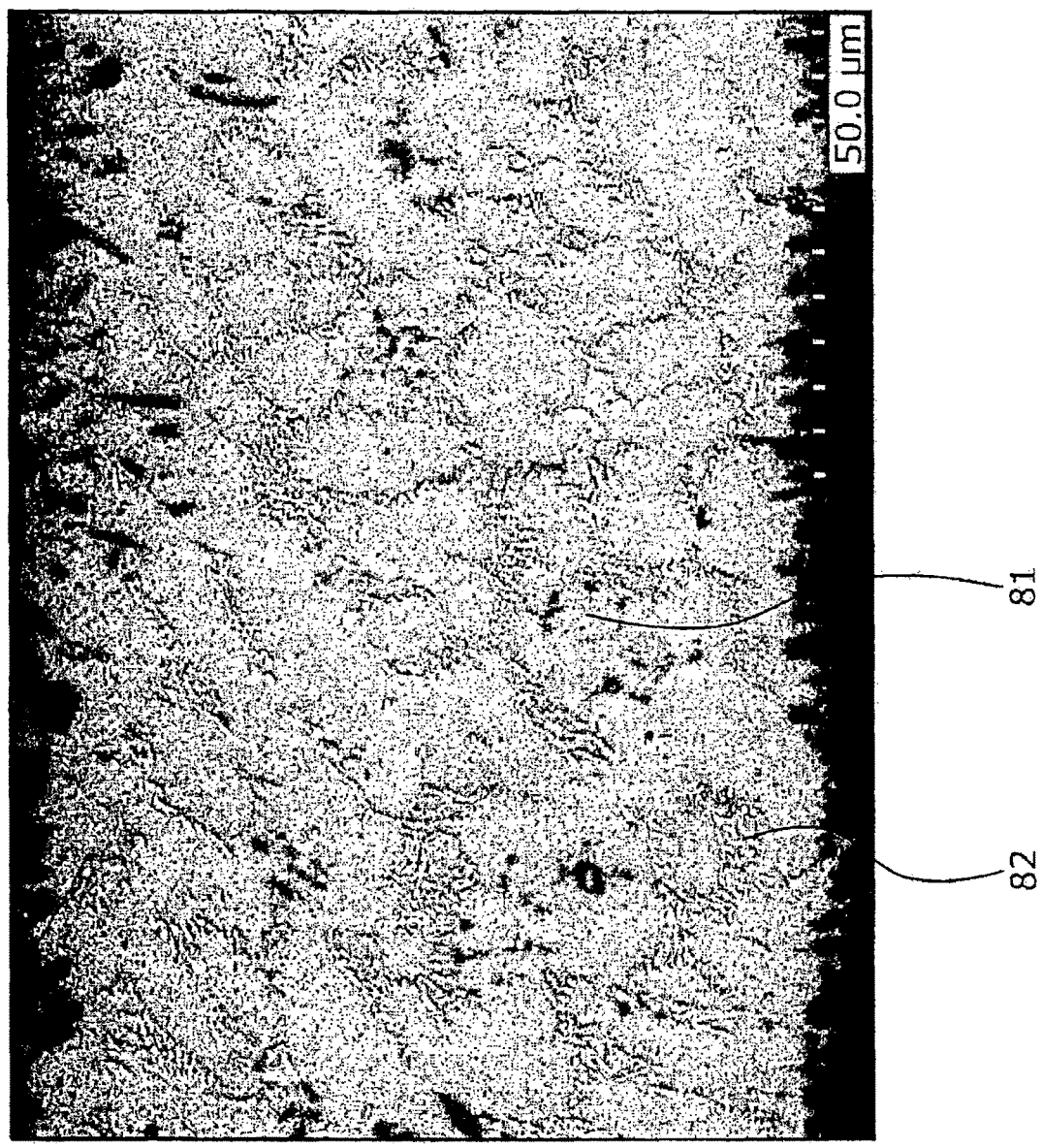
FIG. 12 is a cross-sectional diagram illustrating a state of a solder joint layer in Example 5 at the time of a power cycling reliability test.
Figure 13:
FIG. 13 is a cross-sectional diagram illustrating another state of a solder joint layer in Example 4 at the time of a power cycling reliability test.
Figure 14:
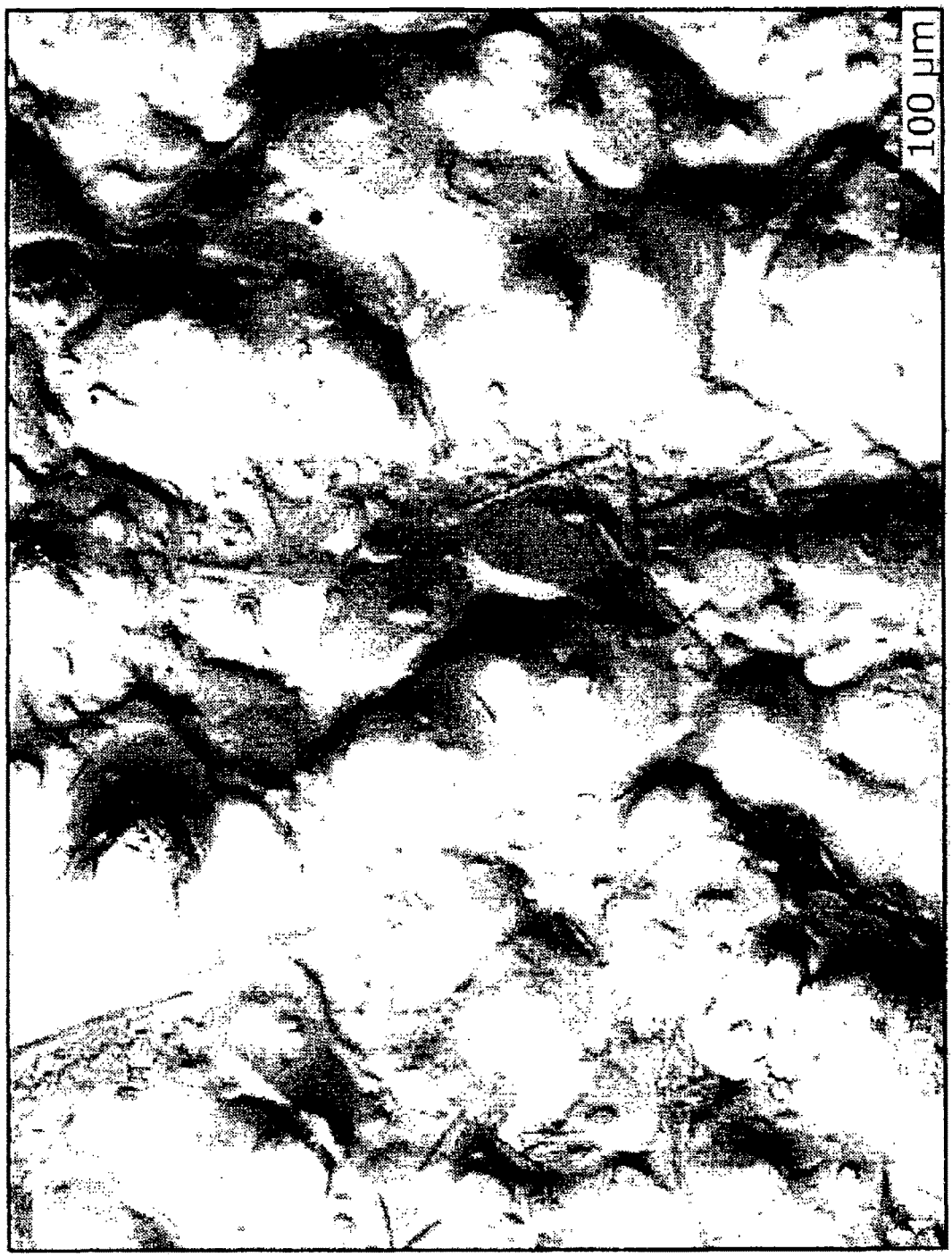
FIG. 14 is a cross-sectional diagram illustrating another state of a solder joint layer in Example 5 at the time of a power cycling reliability test.

The results of the power cycling reliability test in a case where the solder joint layers 11, 12 were formed using a mixed paste will be described. Solder joint layers 11, 12 were formed by solder joining using a mixed paste, and the state of the solder joint layers 11, 12 at the time of a power cycling reliability test was observed. The results are illustrated in FIGS. 11, 12 (hereafter, Examples 4 and 5). FIG. 11 is a cross-sectional diagram illustrating a state of the solder joint layer of Example 4 at the time of the power cycling reliability test. FIG. 12 is a cross-sectional diagram illustrating a state of the solder joint layer of Example 5 at the time of the power cycling reliability test. FIGS. 11, 12 illustrate Examples 4 and 5 of a case where the thermal treatment was performed with the thermal treatment temperature set to 260° C., in a nitrogen atmosphere, and for about 300 seconds (5 minutes). FIGS. 13, 14 illustrate respectively Examples 4 and 5 in which the thermal treatment was performed with the thermal treatment temperature set to 230° C. (maximum 232° C.), in a nitrogen atmosphere, for about 300 seconds (5 minutes). The temperature decrease rate was set to 10° C./sec. FIG. 13 is a cross-sectional diagram illustrating another state of the solder joint layer of Example 4 at the time of the power cycling reliability test. FIG. 14 is a cross-sectional diagram illustrating another state of the solder joint layer of Example 5 at the time of the power cycling reliability test.

Figure 15:
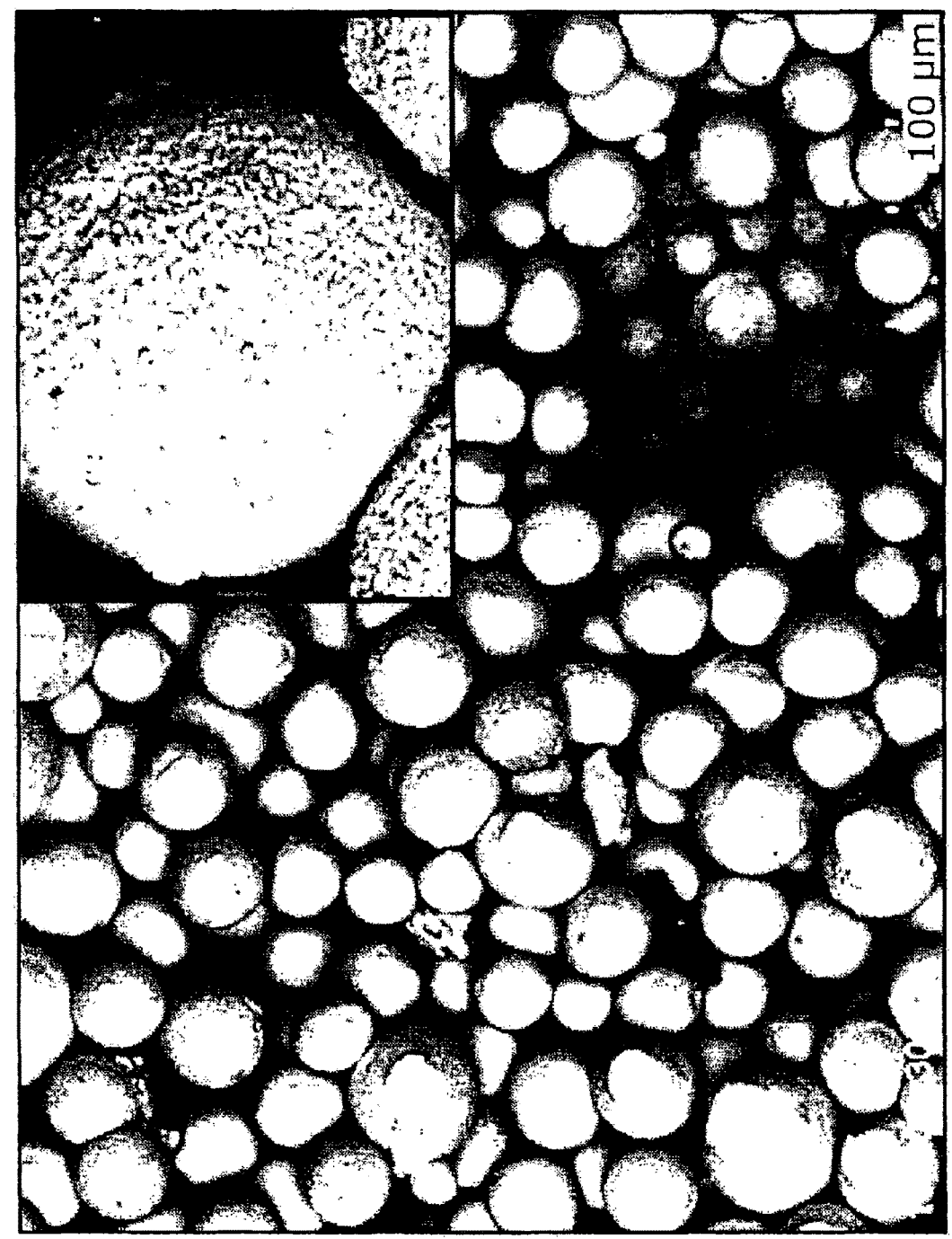
FIG. 15 is a cross-sectional diagram illustrating another state of a solder joint layer in Example 1 at the time of a power cycling reliability test.

In Example 4, a solder joint layer was formed by solder joining using a mixed paste resulting from mixing a first powder of a 70Sn30Sb alloy (alloy including 70.0 wt % of Sn and 30.0 wt % of Sb) and a second powder of a 96Sn4Ag alloy (alloy including 96.0 wt % of Sn and 4.0 wt % of Ag). The weight ratio of the first powder and the second powder in Example 4 was 1:2.8. In Example 5, a solder joint layer was formed by solder joining using a mixed paste resulting from mixing a first powder of a 70Sn30Sb alloy (alloy including 70.0 wt % of Sn and 30.0 wt % of Sb) and a second powder of a 96Sn4Ag alloy (alloy including 96.0 wt % of Sn and 4.0 wt % of Ag). The weight ratio of the first powder and the second powder in Example 5 was 1:1. Third crystal sections (SnSb compound) were observed to form in Example 4 and 5 as well, by X-Ray Photoelectron Spectroscopy (XPS), as in the case of Example 1. In FIGS. 11, 12, the first and third crystal sections are denoted collectively by the reference symbol 81. FIG. 15 illustrates Example 1 in a case where the thermal treatment was performed, for comparison, with the thermal treatment temperature set to 230° C. (maximum 232° C.), in a nitrogen atmosphere, for about 300 seconds (5 minutes). FIG. 15 is a cross-sectional diagram illustrating another state of the solder joint layer of Example 1 at the time of the power cycling reliability test.

The results of FIGS. 11, 12 reveal that in Examples 4 and 5 as well, which involved solder joining using a mixed paste, first crystal sections (including third crystal sections) 81 and second crystal sections 82 were observed to form similarly to the case in Example 1 (FIG. 3A), which involved solder joining using a homogeneous paste that included a 89Sn8Sb3Ag solder material. More specifically, it was found that, as is the case where the solder joint layers 11, 12 are formed using a homogeneous paste, it is possible to achieve in the solder joint layers 11, 12, a homogeneous metal structure in which the first crystal sections (including the third crystal sections) 81 and the second crystal sections 82 are arrayed substantially regularly, also in a case where the solder joint layers 11, 12 are formed using a mixed paste. It was found that in Examples 4 and 5, both the first crystal sections (including the third crystal sections) 81 and the second crystal sections 82 were made yet finer, and a yet more homogeneous metal structure could be achieved than in the case of Example 1. By using the mixed paste, thus, it becomes possible to suppress coarsening of the first and third crystal sections, caused by aggregation of the third crystal sections, to a yet greater degree than when using the homogeneous paste. The reasons for this are as follows.

As illustrated in FIGS. 13, 14, melting was observed to occur at about 230° C., in Examples 4 and 5 where a mixed paste was used. As illustrated in FIG. 15, on the other hand, no melting was observed at a temperature of about 230° C. of the heating plate on which a semiconductor chip was placed, in Example 1, where a homogeneous paste was used. Although not illustrated in the figures, melting is not complete, and voids are observed to occur, at a temperature of about 260° C. of the heating plate on which a semiconductor chip was placed, in Example 1, where a homogeneous paste was used. It can thus be concluded that faster melting in Examples 4 and 5, in which a mixed paste was used, than in Example 1, in which a homogeneous paste was used, arises from the second powder, which includes no Sb, melting first and diffusing into the first powder, in the mixed paste. It is deemed that progress of liquefaction of the mixed paste in a shorter time in Examples 4 and 5 results in ongoing refinement of the first crystal sections (including the third crystal sections) 81 and the second crystal sections 82.

Figure 5:
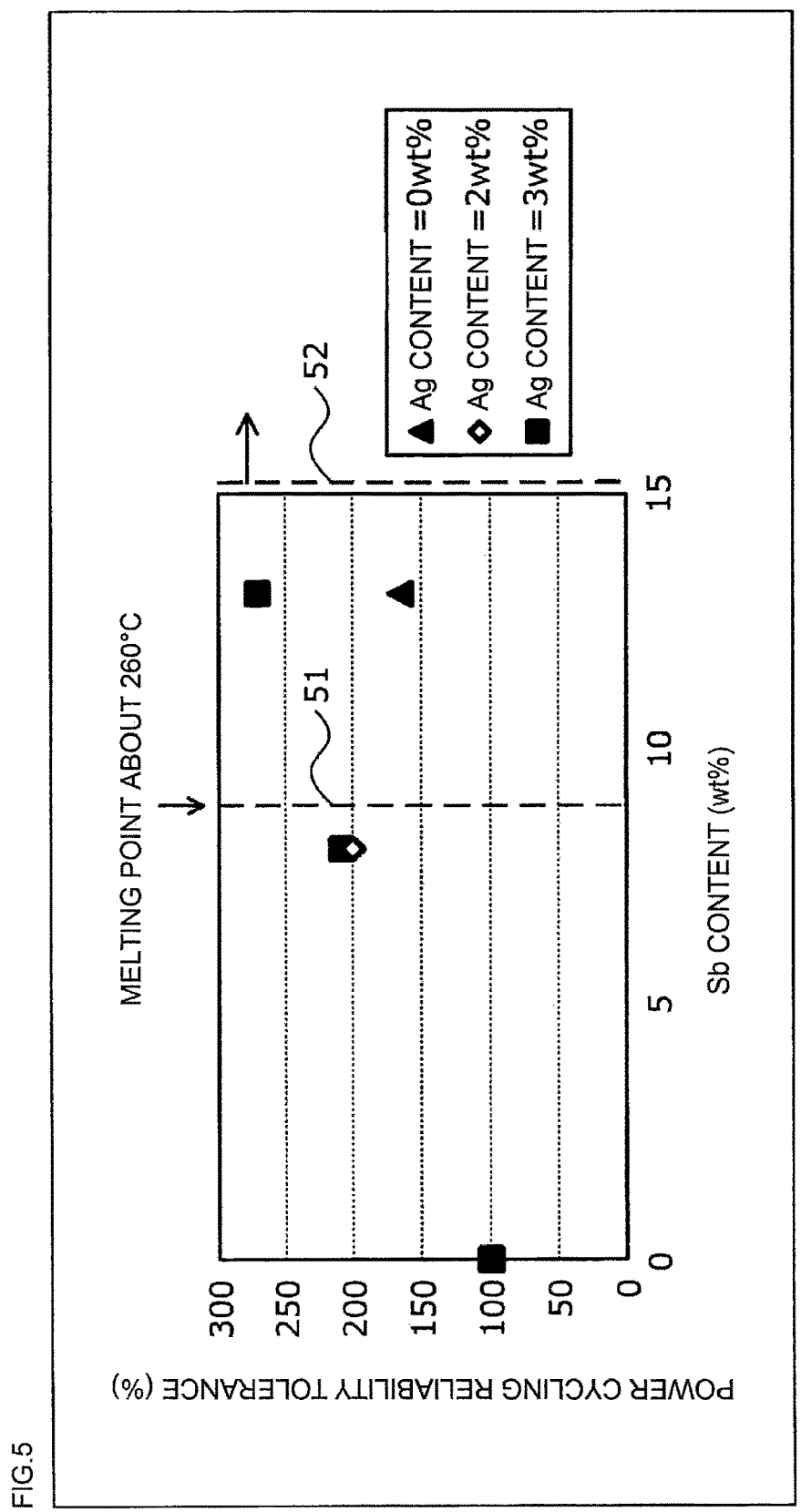
FIG. 5 is a characteristic diagram illustrating a relationship between Sb content in a semiconductor device and power cycling reliability tolerance.

The content of Sb in the solder joint layers 11, 12 will be discussed. FIG. 5 is a characteristic diagram illustrating the relationship between Sb content in a semiconductor device and power cycling reliability tolerance. FIG. 5 illustrates results of measurements of power cycling reliability tolerance in produced samples of solder joint layers 11, 12 by the (100-x-y)SnxSbyAg solder materials including Sn (100-x-y)wt %, Sb x wt % and Ag y wt % of Example 1 (solder joint layer by a homogeneous paste including a 89Sn8Sb3Ag solder material), Comparative Example 1 (solder joint layer by a homogeneous paste including a 87Sn13Sb solder material), Example 3 (solder joint layer by a homogeneous paste including a 84Sn13Sb3Ag solder material), and, in addition, also produced samples of Example 2 and Comparative Example 2. In Comparative Example 2, a solder joint layer was formed by solder joining using a homogeneous paste including a 97Sn3Ag solder material (solder material including 97.0 wt % of Sn and 3.0 wt % of Ag).

The temperature in the thermal treatment of Comparative Example 2 was set to 280° C., the hold time to 5 minutes, and the temperature decrease rate to 10° C./sec. In Example 2, a solder joint layer was formed by solder joining using a homogeneous paste including a 90Sn8Sb2Ag solder material (solder material including 90.0 wt % of Sn, 8.0 wt % of Sb and 2.0 wt % of Ag). The temperature in the thermal treatment of Example 2 was set to 270° C., the hold time to 5 minutes, and the temperature decrease rate to 10° C./sec.

The black square symbol (■) of a sample including 97 wt % of Sn and 3 wt % of Ag, i.e. Sb content set to 0 wt % and Ag content set to 3 wt % (power cycling reliability tolerance=100%) denotes a conventional Sn—Ag-based solder joint layer (Comparative Example 2). The power cycling reliability tolerance (%) given in the ordinate axis of FIG. 5 was calculated taking Comparative Example 2 as a reference. The abscissa axis in FIG. 5 represents Sb content (wt %).

Reference line 51 in FIG. 5 denotes the proximity of the melting point 260° C. of the solder material, such that the further to the left from the reference line 51, the lower the melting point is, and the further to the right of the reference line 51, the higher the melting point is. FIG. 4B illustrates a cross-sectional diagram illustrating the state of solder joint layer of Comparative Example 2 at the time of the power cycling reliability test. FIG. 4B is a cross-sectional diagram illustrating the state of solder joint layer of Comparative Example 2 at the time of the power cycling reliability test.

Composition analysis results for the compositions of Examples 1 to 3 were as follows. The first crystal sections were Sn atoms:Sb atoms=1:p (0<p≤0.1), the first intermetallic compound (first portion) of the second crystal sections was, for instance, an $Ag_3Sn$ (Sn atoms:Ag atoms=1:3) compound or $Ag_4Sn$ (Sn atoms:Ag atoms=1:4) compound, within a range of Sn atoms:Ag atoms=1:q (2≤q≤5).

The second intermetallic compound (second portion) in the second crystal sections was mainly, for instance, a $Cu Sn_5$ (Sn atoms:Cu atoms=5:6) compound or $Cu_3Sn$ (Sn atoms:Cu atoms=1:3) compound, within a range Sn atoms:Cu atoms=1:r (0.44). The third crystal sections was a SnSb (Sn atoms:Sb atoms=1:1) compound or $Sb_2Sn_3$ (Sn atoms:Sb atoms=3:2) compound, within a range Sn atoms:Sb atoms=1:s (0.8≤s≤1.6). The average grain size of the second crystal sections was observed, by cross-sectional SEM microscopy, to be smaller than the average grain size of the first crystal sections.

The results of FIG. 5 revealed that the power cycling reliability tolerance in Examples 1 to 3 can be increased, with respect to that of Comparative Example 2, by increasing the Sb content to be greater than 0 wt %. It was observed that the greater the increase in Sb content, the more the power cycling reliability tolerance could be enhanced. More specifically, it was observed that a power cycling reliability tolerance about twice that of Comparative Example 2 was obtained in the vicinity of 250° C. (melting point of the solder materials for producing Examples 1 and 2, and that a power cycling reliability tolerance greater than twice that of Comparative Example 2 was obtained in the vicinity of 290° C. (melting point of the solder material for producing Example 3). As FIGS. 3A, 3B reveal, no cracks or the like were observed in Examples 1 to 3. Therefore, it was found that the semiconductor device according to the disclosure of the present application is sufficiently compatible with semiconductor devices installed in automobiles and semiconductor devices for new energy applications, used in environments at a temperature of about 175° C. and from which high reliability is required. In the case of Comparative Example 2, coarsening of the AgSn compound 42 to a grain size of about 5 μm, as well as the occurrence of cracks 44, were observed in a solder joint layer 40, as illustrated in FIG. 4B, similar to those in a conventional Sn—Ag-based solder material to which no Sb is added. This is deemed to be the cause of the poorer power cycling reliability tolerance. In a case where the Sb content was greater than 15 wt % (further to the right of the dotted line denoted by reference symbol 52 in FIG. 5), the melting point of the solder material rose excessively, and impaired solder wettability was observed. Accordingly, the Sb content in the solder joint layers 11, 12 is preferably larger than 0 wt %, up to 15 wt %.

Figure 6:
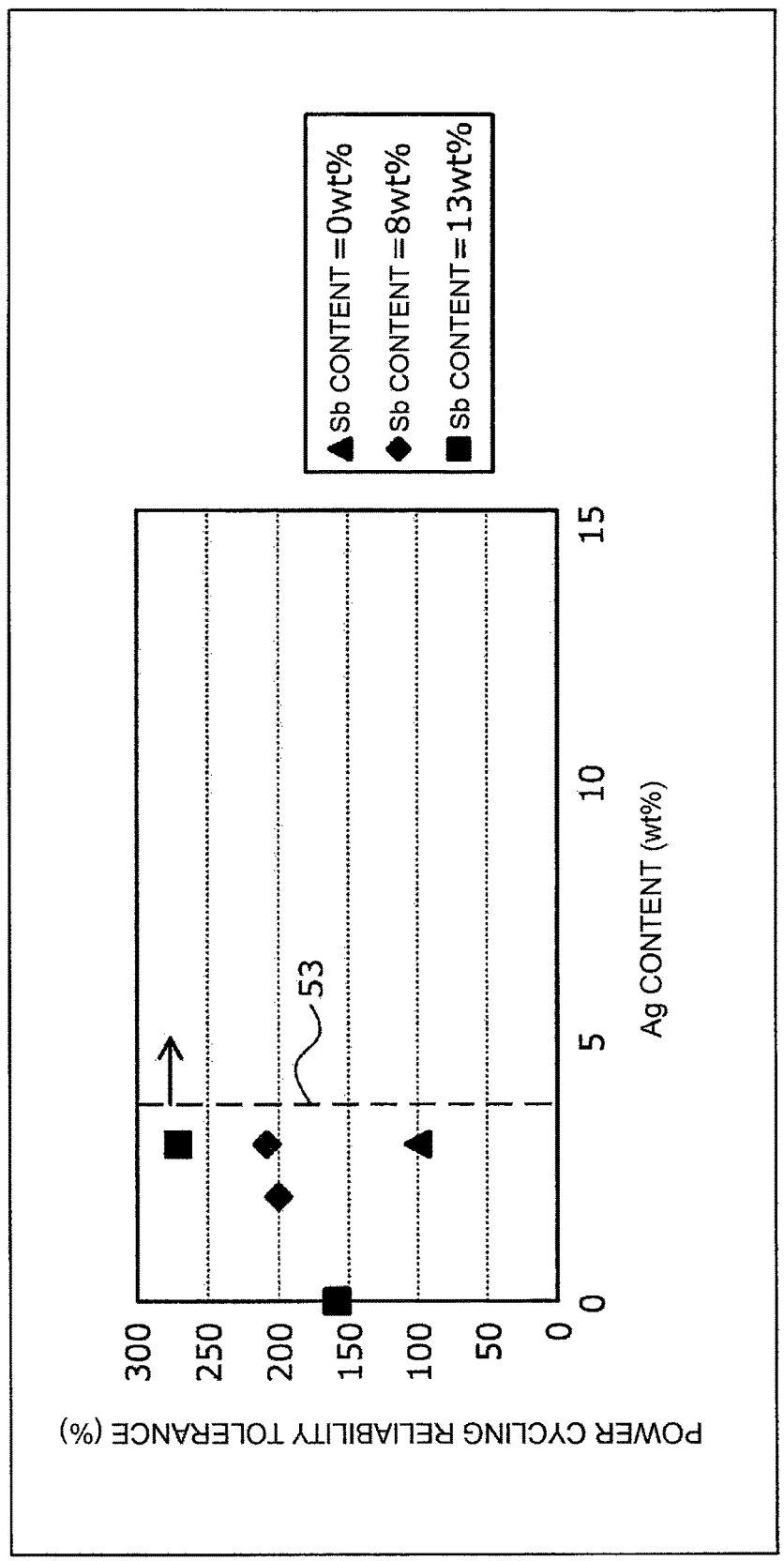
FIG. 6 is a characteristic diagram illustrating a relationship between Ag content in a semiconductor device and power cycling reliability tolerance.
Figure 7:
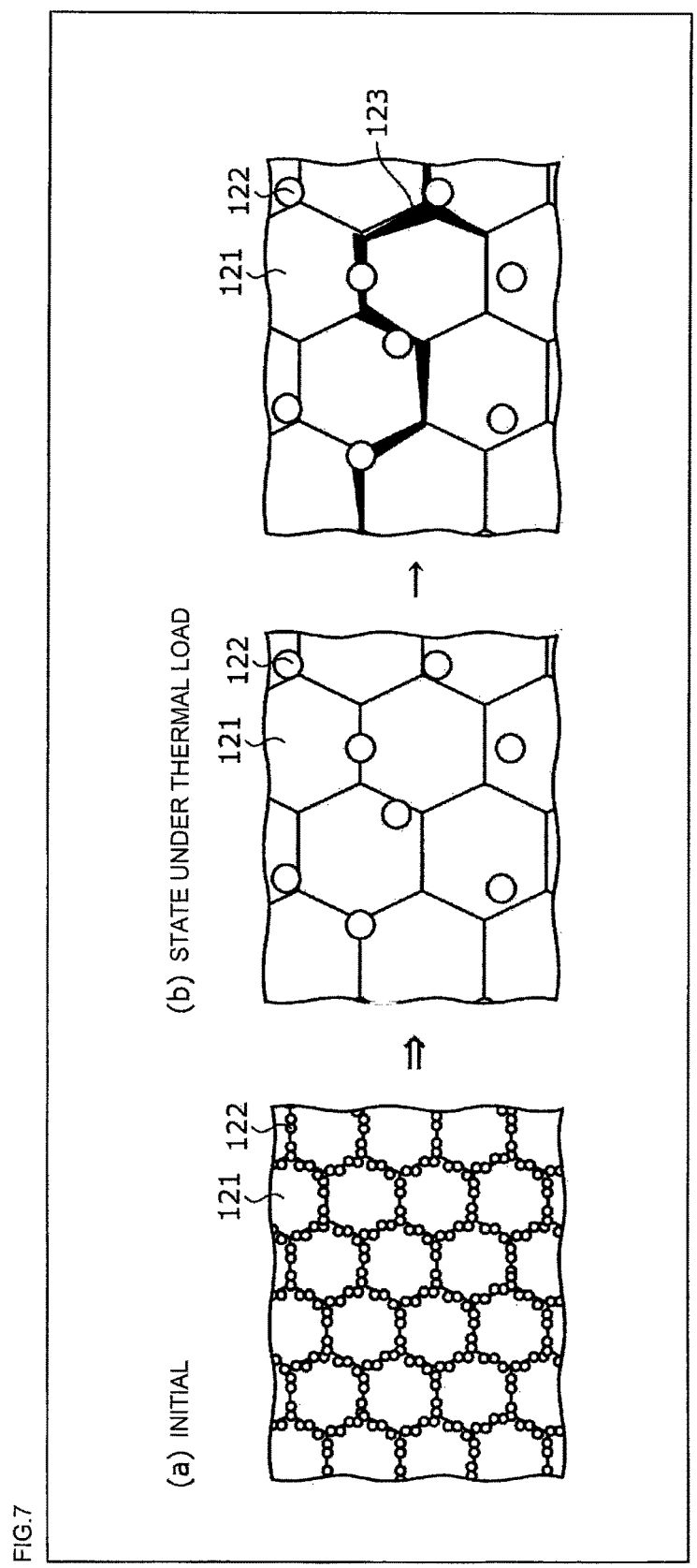
FIG. 7 is an explanatory diagram illustrating schematically a state of a solder joint layer by a conventional Sn—Ag-based solder material.
Figure 8:
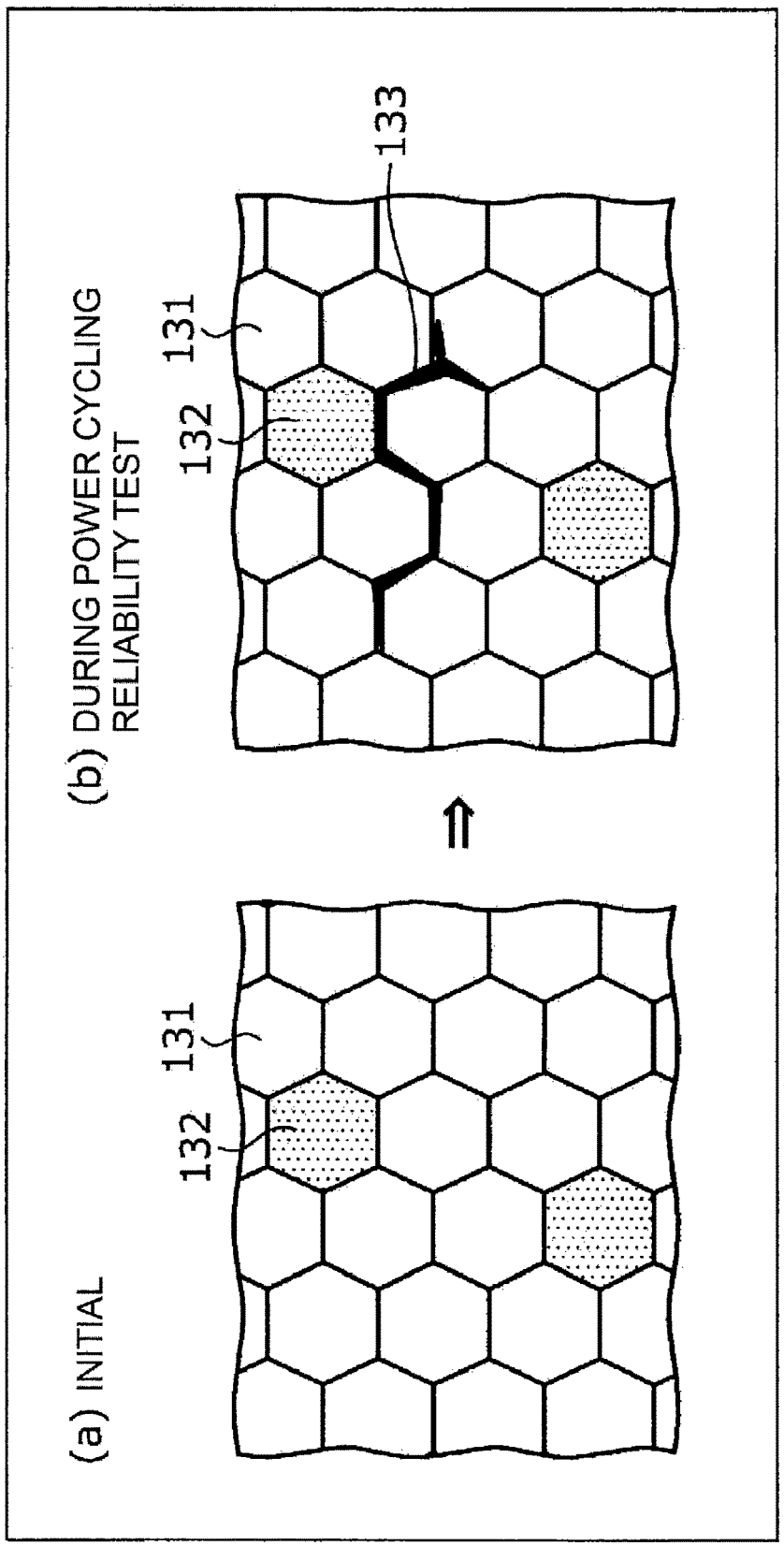
FIG. 8 is an explanatory diagram illustrating schematically a state of a solder joint layer by a conventional Sn—Sb-based solder material.

The content of Ag in the solder joint layers 11, 12 will be described. FIG. 6 is a characteristic diagram illustrating the relationship between Ag content in a semiconductor device and power cycling reliability tolerance. FIG. 6 illustrates results of measurements of power cycling reliability tolerance in solder joint layers 11, 12 by (100-x-y)SnxSbyAg solder materials including Sn (100-x-y)wt %, Sb x wt % and Ag y wt %.

The black triangle symbol (▲) of a sample including 97 wt % of Sn and 3 wt % of Ag, i.e. Sb content set to 0 wt % and Ag content set to 3 wt % (power cycling reliability tolerance=100%) denotes Comparative Example 2 described above. The power cycling reliability tolerance (%) given in the ordinate axis of FIG. 6 was calculated taking Comparative Example 2 as a reference. The abscissa axis in FIG. 6 represents Ag content (wt %). The black square symbol (■) of a sample including 87 wt % of Sn and 13 wt % of Sb, i.e. Sb content set to 13 wt % and Ag content set to 0 wt % (power cycling reliability tolerance=about 150%) denotes a conventional Sn—Sb-based solder joint layer (Comparative Example 1).

The results of FIG. 6 revealed that the power cycling reliability tolerance can be increased with respect to that of Comparative Examples 1 and 2 by increasing the Sb content to be greater than 0 wt %, and the Ag content to be greater than 0 wt %. It was observed that the greater the increase in Ag content, the more the power cycling reliability tolerance could be enhanced. In a case where the Ag content was greater than 3 wt % (further to the right of the dotted line denoted by reference symbol 53), solderability was observed to decrease, and material cost to increase. Accordingly, the Ag content in the solder joint layers 11, 12 is preferably larger than 0 wt %, up to 3 wt %.

In the embodiment (Example 2), as described above, a solder joint layer is made up of, and strengthened by, first crystal sections (Sn crystal grains), having Sb in solid solution, and arrayed substantially regularly configuring a uniform metal structure, and by plural second crystal sections that precipitate at crystal grain boundaries between the first crystal sections that are dispersed as a matrix. The average grain size of the second crystal sections was smaller than the average grain size of the first crystal sections. The average grain size of the first crystal sections was 30 v, and the average grain size of the second crystal sections was 0.8 v. More specifically, the entire first crystal sections are solid-solution strengthened by the Sb that forms a solid solution in the first crystal sections. As a result, it becomes possible to suppress coarsening of the first crystal sections consequent to the thermal load in, for instance, power cycling. The crystal grain boundaries between the first crystal sections dispersed in the form of a matrix are strengthened, and crystals of the first crystal sections are thus rendered less likely to deform, by the first intermetallic compound (compound including Sn and Ag) being the second crystal sections that are harder and more fine-grained than the first crystal sections. Accordingly, the progress of intra-grain cracks and grain boundary cracks can be suppressed to a greater degree than in the case of conventional Sn—Ag-based solder joint layers and Sn—Sb-based solder joint layers, and power cycling reliability can be likewise enhanced.

In the embodiments (Examples 1 and 3), part of the first crystal sections constitutes third crystal sections through reaction with Sb that is in excess of the solid solution limit; as a result, stress-derived strain is less likely to occur in the solder joint layers. Crystals in the first crystal sections deform less readily as a result. The third crystal sections are harder than the first crystal sections. Accordingly, progress of intra-grain cracks can be suppressed to a yet greater degree. In turn, this allows further enhanced power cycling reliability tolerance. In the above embodiments, the second crystal sections may have a second intermetallic compound (compound including Sn and Cu) that is formed during joining of solder with a Cu member, and consequent to thermal load from power cycling. The crystal grain boundaries between the first crystal sections dispersed as a matrix are further strengthened by further incorporating the second intermetallic compound (second portion) in addition to the first intermetallic compound (first portion) as the second crystal sections. The progress of grain boundary cracks can be suppressed as a result to a greater degree than in the case of conventional Sn—Ag-based solder joint layers and Sn—Sb-based solder joint layers. Power cycling reliability tolerance can therefore be further enhanced.

In the embodiments, the melting point of the solder joint layer can be set to a temperature lower than 300° C., for instance a temperature of 260° C. or lower (for example, about 230° C.), by forming the first and the second crystal sections or the third crystal sections to a predetermined grain size and composition, without addition of Ag to a high concentration. Through a soldering process at a temperature lower than 300° C., it becomes possible thus to achieve a power cycling reliability tolerance comparable or superior to that of, for instance, conventional Sn—Sb-based solder joint layers, which require a soldering process at a temperature of 300° C. or higher. Since the soldering process can be performed at a temperature lower than 300° C., the thermal load that acts on the semiconductor device can be reduced, and a highly reliable semiconductor device can be provided that is less susceptible to the adverse effects of thermal load than conventional semiconductor devices. Through formation of a solder joint layer using a mixed paste obtained by mixing a first powder including Sb and a second powder including no Sb, the embodiments allow imparting the solder joint layer with a uniform metal structure in which first to third crystal sections are arrayed more substantially regularly than in a case where the solder joint layer is formed using a homogeneous paste including a powder of one alloy.

The power cycling reliability tolerance was 230 (%) in Example 4 and 240 (%) in Example 5. Thus, a uniform metal structure is obtained in which the first to third crystal sections are arrayed substantially regularly and the first and second crystal sections are made finer, so that power cycling reliability can be enhanced as a result.

The present invention is not limited to the embodiments described above, and may accommodate various modifications without departing from the gist of the invention. In a case where, for instance, the semiconductor device is provided with plural solder joint layers, the solder joint layers may have identical or different compositions, so long as the compositions are within the ranges described above.

Thus, according to the disclosure, a solder joint layer is made up of, and strengthened by, first crystal sections (tin crystal grains) having antimony in solid solution, and arrayed substantially regularly configuring a uniform metal structure, and second crystal sections including plural first portions (compound including tin and silver) or second portions (compound including tin and copper), or both, precipitated at crystal grain boundaries between the first crystal sections. More specifically, the first crystal sections overall are solid-solution strengthened by the antimony that forms a solid solution in the first crystal sections. As a result, it becomes possible to suppress coarsening of the first crystal sections consequent to thermal load in, for instance, power cycling. The crystal grain boundaries between the first crystal sections are strengthened by the second crystal sections, such that crystals in the first crystal sections do not deform readily. Accordingly, the progress of intra-grain cracks and grain boundary cracks can be suppressed to a greater degree than in the case of conventional tin-silver-based solder joint layers and tin-antimony-based solder joint layers.

According to the disclosure, part of the first crystal sections constitutes third crystal sections through reaction with antimony that is in excess of the solid solution limit; as a result, stress-derived strain does not occur readily in the solder joint layers. Crystals in the first crystal sections deform less readily as a result. The invention enables the melting point of the solder joint layer to be set to a temperature lower than 300° C., for instance a temperature of 260° C. or lower, by way of the first and second crystal sections. As a result, it becomes possible, through a soldering process at a temperature lower than 300° C., to achieve a power cycling reliability tolerance comparable or superior to that of, for instance, conventional tin-antimony-based solder joint layers, which require a soldering process at a temperature of 300° C. or higher. Since the soldering process can be performed at a temperature lower than 300° C., the thermal load that acts on the semiconductor device can be reduced. A semiconductor device can thus be provided that is less susceptible to the adverse effects of thermal load than conventional semiconductor devices. The power cycling reliability tolerance denotes herein the number of repeats upon repeated intermittent energization of a semiconductor device until a necessary predetermined characteristic as a semiconductor device can no longer be obtained consequent to repeated heat generation and the stress associated therewith. Through formation of a solder joint layer using a mixed paste obtained by mixing a first powder including antimony and a second powder including no antimony, the disclosure enables imparting the solder joint layer with a uniform metal structure in which first to third crystal sections are arrayed more substantially regularly than in a case where the solder joint layer is formed using a homogeneous paste including a powder of one alloy.

The semiconductor device and manufacturing method of a semiconductor device according to the present invention elicit the effects of enabling a semiconductor device and a manufacturing method of a semiconductor device to be provided such that the semiconductor device can be solder-joined at a low melting point and has a highly reliable solder joint layer.

The semiconductor device and manufacturing method of a semiconductor device according to the disclosure are useful in package-structure semiconductor devices in which various members such as semiconductor chips and circuit patterns are joined by way of solder joint layers.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device in which constituent parts in one set thereof are joined by a solder joint layer, the solder joint layer comprising:
   first crystal sections containing tin and antimony at a ratio of tin atoms:antimony atoms=1:p ($0<p\leq0.1$); and
   second crystal sections having at least one among a first portion containing tin and silver at a ratio of tin atoms:silver atoms=1:q ($2\leq q\leq5$) and a second portion containing tin and copper at a ratio of tin atoms:copper atoms=1:r ($0.4\leq r\leq4$), wherein
   average grain size of the second crystal sections is smaller than average grain size of the first crystal sections.

2. The semiconductor device according to claim 1, wherein the solder joint layer has third crystal sections containing tin and antimony at a ratio of tin atoms:antimony atoms=1:s ($0.8\leq s\leq1.6$).

3. The semiconductor device according to claim 2, wherein
   the first crystal sections are tin crystal grains with antimony in solid solution, and
   the third crystal sections are crystal grains resulting from a reaction between the first crystal sections and antimony that is in excess of a solid solution limit in the first crystal sections.

4. The semiconductor device according to claim 1, wherein the first crystal sections are tin crystal grains with antimony in solid solution.

5. The semiconductor device according to claim 1, wherein the second crystal sections precipitate at crystal grain boundaries between the first crystal sections.

6. The semiconductor device according to claim 1, wherein average grain size of the first portion is 1 μm or less.

7. The semiconductor device according to claim 1, wherein the solder joint layer has a melting point of 260° C. or lower.

8. A manufacturing method of a semiconductor device in which constituent parts in one set thereof are joined by a solder joint layer, the manufacturing method comprising:

a step of coating one of the constituent parts with a solder paste that contains a mixture of an alloy powder containing antimony, and an alloy powder containing no antimony; and a step of solidifying the solder paste by a thermal treatment to form the solder joint layer, and joining the constituent parts to each other by way of the solder joint layer, wherein the solder joint layer includes:

first crystal sections containing tin and antimony at a ratio of tin atoms:antimony atoms=1:p ($0<p\leq0.1$); and second crystal sections having at least one among a first portion containing tin and silver at a ratio of tin atoms:silver atoms=1:q ($2\leq q\leq 5$) and a second portion containing tin and copper at a ratio of tin atoms:copper atoms=1:r ($0.4\leq r\leq 4$), and average grain size of the second crystal sections is smaller than average grain size of the first crystal sections.

* * * * *